(12) United States Patent
Kajiyama et al.

(10) Patent No.: US 12,313,840 B2
(45) Date of Patent: May 27, 2025

(54) OPTICAL SCANNING DEVICE, DISTANCE MEASURING DEVICE, AND METHOD FOR MANUFACTURING OPTICAL SCANNING DEVICE

(71) Applicant: Mitsubishi Electric Corporation, Tokyo (JP)

(72) Inventors: Yoshitaka Kajiyama, Tokyo (JP); Yoshiaki Hirata, Tokyo (JP); Kozo Ishida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 518 days.

(21) Appl. No.: 17/793,051

(22) PCT Filed: Mar. 12, 2020

(86) PCT No.: PCT/JP2020/010875
§ 371 (c)(1),
(2) Date: Jul. 15, 2022

(87) PCT Pub. No.: WO2021/181618
PCT Pub. Date: Sep. 16, 2021

(65) Prior Publication Data
US 2023/0047188 A1    Feb. 16, 2023

(51) Int. Cl.
*G02B 26/08*       (2006.01)
*G02B 26/10*       (2006.01)

(52) U.S. Cl.
CPC ......... *G02B 26/0841* (2013.01); *G02B 26/10* (2013.01)

(58) Field of Classification Search
CPC .. G02B 26/0841; G02B 26/085; G02B 26/10; B81B 2201/042
See application file for complete search history.

(56) References Cited

U.S. PATENT DOCUMENTS

| 2004/0105139 A1 | 6/2004 | Hirose et al. |
| 2006/0007514 A1 | 1/2006 | Desai |
(Continued)

FOREIGN PATENT DOCUMENTS

| CN | 101149475 A | 3/2008 |
| CN | 108474941 A | 8/2018 |
(Continued)

OTHER PUBLICATIONS

Office Action issued on Aug. 12, 2023, in corresponding Chinese patent Application No. 202080097900.6, 47 pages.
(Continued)

*Primary Examiner* — Angela M. Medich
(74) *Attorney, Agent, or Firm* — XSENSUS LLP

(57) ABSTRACT

An optical scanning device includes a reflector, a rotator, a first torsion beam and a second torsion beam, a first support part, a second support part, a first elastic layer, and a second elastic layer. The first elastic layer is superposed on the first torsion beam. The second elastic layer is superposed on the second torsion beam. A vertical dimension of an active layer is smaller than a horizontal dimension of the active layer in a cross section orthogonal to a direction in which the rotator is interposed between the first torsion beam and the second torsion beam. A material of the first elastic layer and the second elastic layer is higher in fatigue life than metal.

7 Claims, 25 Drawing Sheets

(56) References Cited

U.S. PATENT DOCUMENTS

| | | | |
|---|---|---|---|
| 2008/0078262 A1* | 4/2008 | Murata | G02B 26/085 |
| | | | 74/126 |
| 2010/0244160 A1 | 9/2010 | Kanemoto | |
| 2014/0246737 A1 | 9/2014 | Kinugawa et al. | |
| 2015/0077824 A1 | 3/2015 | Yasuda | |
| 2019/0031500 A1 | 1/2019 | Takimoto et al. | |
| 2021/0025986 A1 | 1/2021 | Yamaguchi | |

FOREIGN PATENT DOCUMENTS

| | | |
|---|---|---|
| EP | 686863 A1 | 12/1995 |
| JP | 2722314 B2 | 3/1998 |
| JP | 2002-228965 A | 8/2002 |
| JP | 2004-110005 A | 4/2004 |
| JP | 2005-292321 A | 10/2005 |
| JP | 2008-504574 A | 2/2008 |
| JP | 2010-139546 A | 6/2010 |
| JP | 2014-170997 A | 9/2014 |
| JP | 2015-59976 A | 3/2015 |
| JP | 5678442 B2 | 3/2015 |
| JP | 2016-218390 A | 12/2016 |
| JP | 2017-90793 A | 5/2017 |
| WO | 2019/176749 A1 | 9/2019 |

OTHER PUBLICATIONS

International Search Report and Written Opinion mailed on Jul. 14, 2020, received for PCT Application PCT/JP2020/010875, filed on Mar. 24, 2020, 19 pages including English Translation.

Indian Office Action issued Nov. 25, 2022 in counterpart Indian Patent Application No. 202227048870 (with English translation), 8 pages.

* cited by examiner

OPTICAL SCANNING DEVICE, DISTANCE MEASURING DEVICE, AND METHOD FOR MANUFACTURING OPTICAL SCANNING DEVICE

CROSS-REFERENCE TO RELATED APPLICATION

The present application is based on PCT filing PCT/JP2020/010875, filed Mar. 12, 2020, the entire contents of which are incorporated herein by reference.

TECHNICAL FIELD

The present disclosure relates to an optical scanning device, a distance measuring device, and a method for manufacturing an optical scanning device.

BACKGROUND ART

An optical scanning device using a micro electro mechanical systems (MEMS) technology is known. This optical scanning device is compact and is driven with high accuracy. The optical scanning device is to scan light emitted to a reflector by rotating a rotator on which the reflector is superposed about a first torsion beam and a second torsion beam. The rotator, the first torsion beam, and the second torsion beam include a common active layer. The active layer is made of, for example, silicon (Si). The active layer is processed by, for example, a semiconductor process such as deep reactive ion etching (DRIE).

For example, in Japanese Patent Laying-Open No. 2005-292321 (PTL 1), a planar actuator (optical scanning device) includes a mirror (reflector), a movable plate (rotator), a torsion bar (first torsion beam and second torsion beam), and a metal film. The movable plate and the torsion bar have a common active layer silicon (active layer). The metal film is superposed on the torsion bar.

CITATION LIST

Patent Literature

PTL 1: Japanese Patent Laying-Open No. 2005-292321

SUMMARY OF INVENTION

Technical Problem

In the planar actuator (optical scanning device) disclosed in PTL 1, the metal film is superposed on the torsion bar (first torsion beam and second torsion beam). This can increase a dimension of the planar actuator of the torsion bar in a thickness direction and can curb an increase in width dimension of the torsion bar. This in turn can reduce a hard spring effect of the planar actuator at the position of the torsion bar and can curb a decrease in maximum deflection angle of the rotator. Note that the hard spring effect is an effect of making a peak frequency higher. Stress generated by the rotation of the rotator is, however, repeatedly applied to the metal film to cause the metal film to deteriorate. This may reduce long-term reliability of the planar actuator.

The present disclosure has been made in view of the above-described problems, and it is therefore an object of the present disclosure to provide an optical scanning device, a distance measuring device, and a method for manufacturing an optical scanning device, the optical scanning device being capable of reducing a hard spring effect at positions of a first torsion beam and a second torsion beam, curbing a decrease in maximum deflection angle of a rotator, and having high long-term reliability.

Solution to Problem

An optical scanning device according to the present disclosure includes a reflector, a rotator, a first torsion beam and a second torsion beam, a first support part, a second support part, a first elastic layer, and a second elastic layer. The reflector is to reflect light. The reflector is superposed on the rotator. The rotator is interposed between the first torsion beam and the second torsion beam. The first torsion beam is interposed between the rotator and the first support part. The second torsion beam is interposed between the rotator and the second support part. The first elastic layer is superposed on the first torsion beam. The second elastic layer is superposed on the second torsion beam. The rotator is rotatable with respect to the first support part and the second support part with the first torsion beam and the second torsion beam as a rotation axis. The rotator, the first torsion beam, and the second torsion beam include a common active layer. A vertical dimension of the active layer is smaller than a horizontal dimension of the active layer in a cross section orthogonal to a direction in which the rotator is interposed between the first torsion beam and the second torsion beam. A material of the first elastic layer and the second elastic laver is an elastic material higher in fatigue life higher than metal.

Advantageous Effects of Invention

In the optical scanning device according to the present disclosure, the first elastic layer is superposed on the first torsion beam. The second elastic layer is superposed on the second torsion beam. This can reduce the hard spring effect of the optical scanning device at the positions of the first torsion beam and the second torsion beam and can curb a decrease in maximum deflection angle of the rotator. Further, the first elastic layer and the second elastic layer are made of an elastic material higher in fatigue life than metal. It is therefore possible to provide the optical scanning device having high long-term reliability.

DESCRIPTION OF EMBODIMENTS

Figure 1:
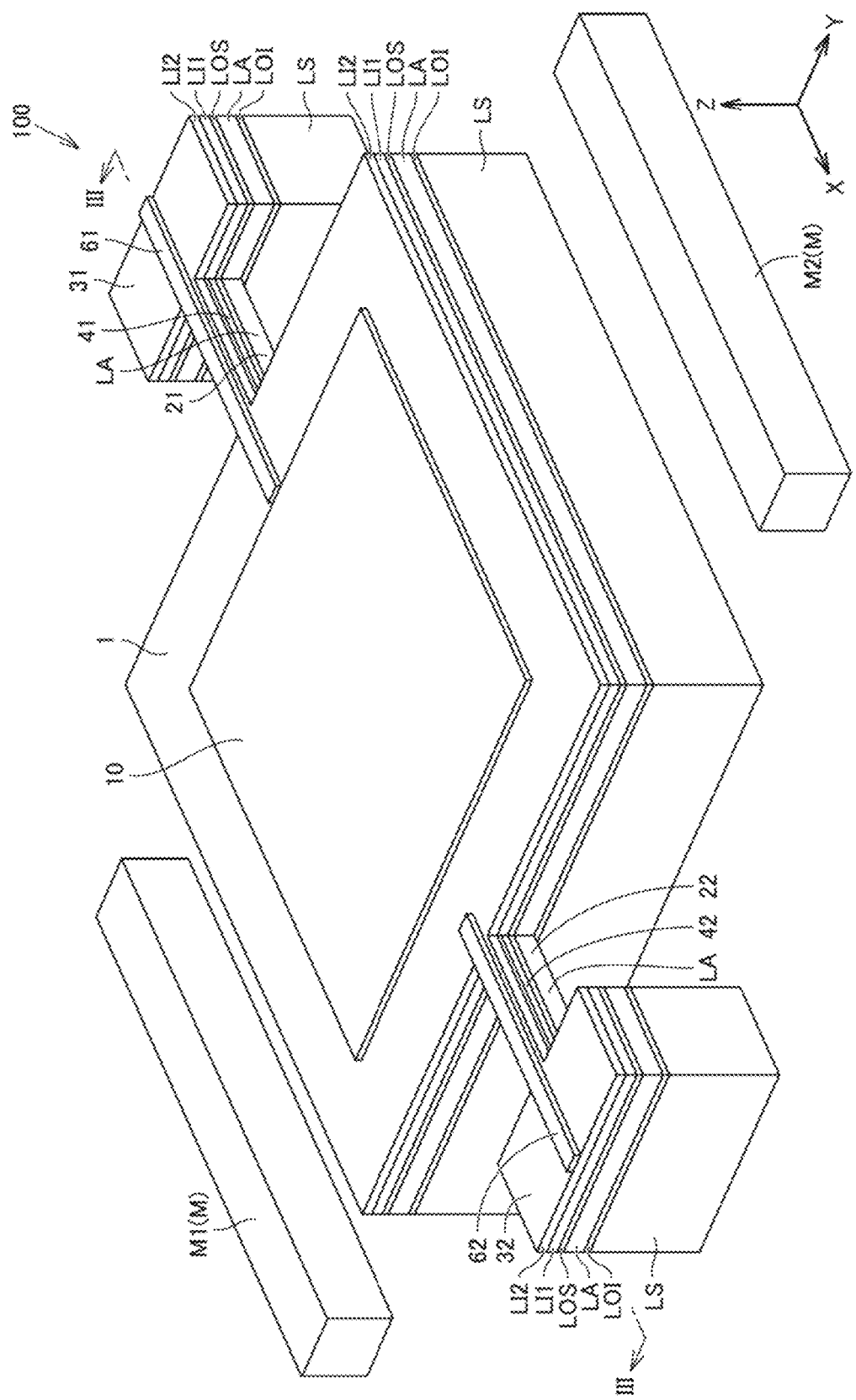
FIG. 1 is a schematic perspective view of a configuration of an optical scanning device according to a first embodiment.

Hereinafter, embodiments will be described with reference to the drawings. Note that, in the following description, the same or corresponding parts are denoted by the same reference numerals to avoid the description from being redundant.

First Embodiment

Figure 2:
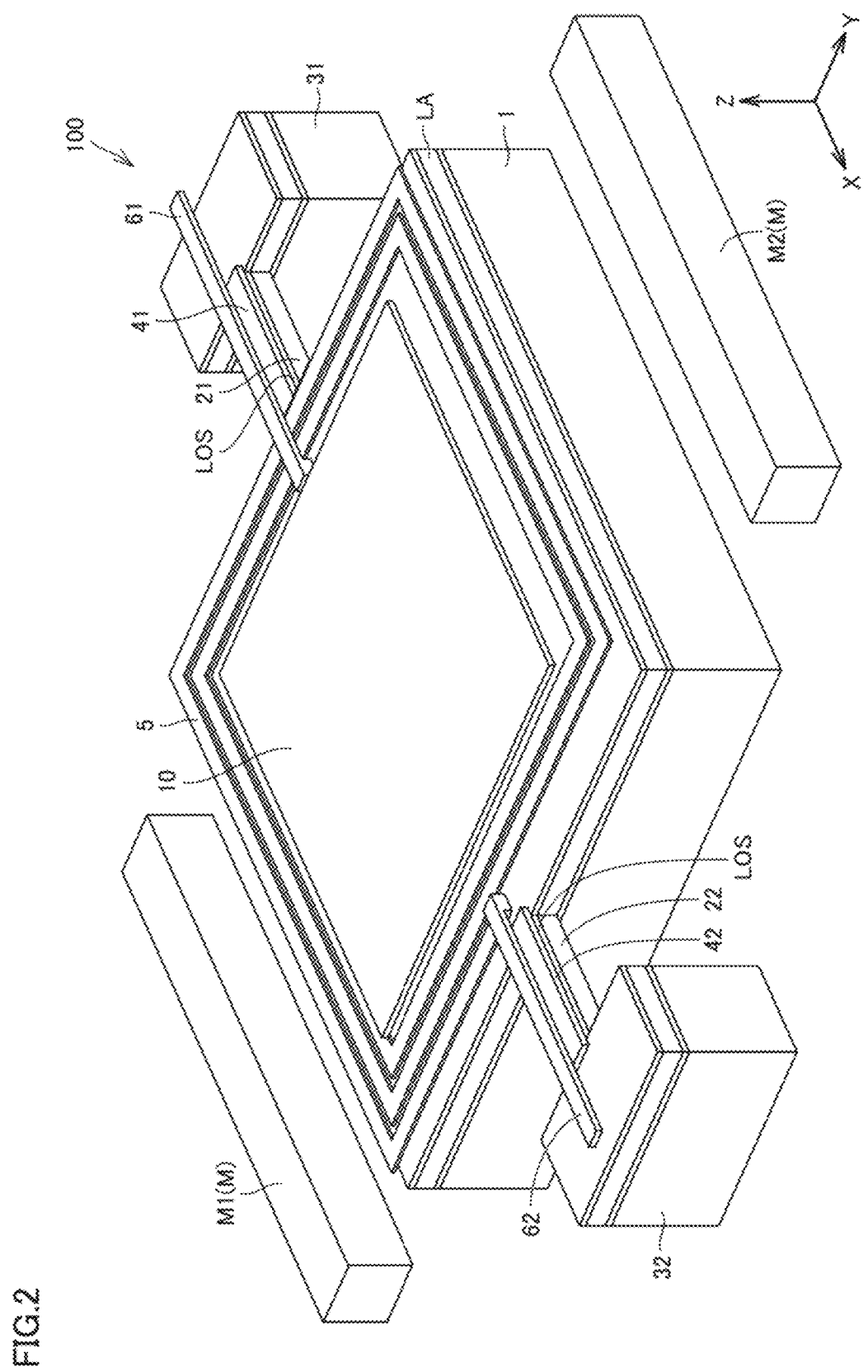
FIG. 2 is a schematic perspective view of the configuration of the optical scanning device according to the first embodiment.
Figure 3:
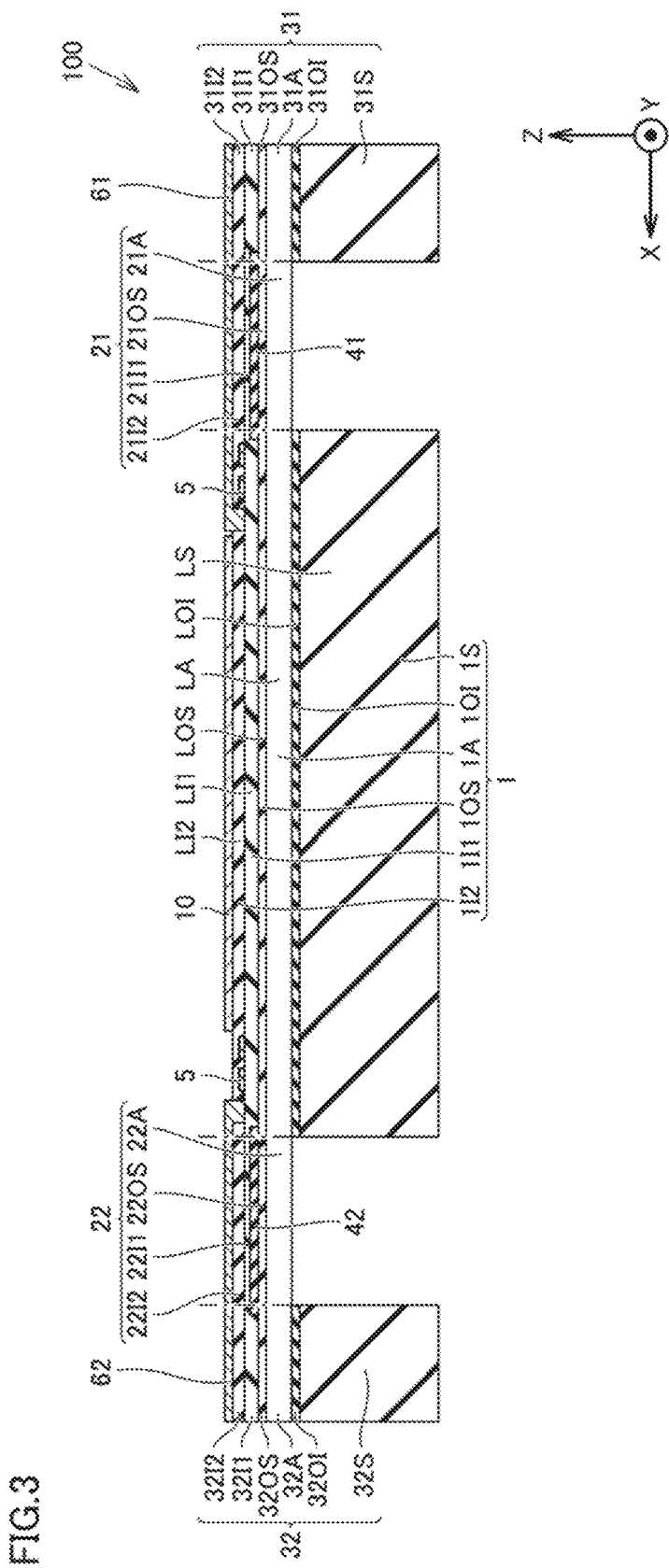
FIG. 3 is a cross-sectional view taken along a line III-III in FIG. 1.

With reference to FIGS. 1 to 3, a description will be given of a configuration of an optical scanning device 100 according to a first embodiment. For convenience of description, a lower insulating film and an upper insulating film are not illustrated in FIG. 2. As illustrated in FIG. 1, optical scanning device 100 includes a reflector 10, a rotator 1, a first torsion beam 21 and a second torsion beam 22, a first support part 31, a second support part 32, a first elastic layer 41, and a second elastic layer 42. In the present embodiment, optical scanning device 100 further includes a magnet M. Optical scanning device 100 may include first metal wiring 61 and second metal wiring 62.

Optical scanning device 100 is to scan light. Optical scanning device 100 is, for example, a micro electro mechanical systems (MEMS) mirror type optical scanning device. Such a MEMS mirror type optical scanning device is applied to, for example, a distance measuring device, a projector, and the like. Optical scanning device 100 is formed by, for example, processing a silicon on insulator (SOI) substrate.

As illustrated in FIG. 1, rotator 1, first torsion beam 21, and second torsion beam 22 include a common active layer LA. A vertical dimension (dimension in a Z-axis direction) of active layer LA is smaller than a horizontal dimension (dimension in a Y-axis direction) of active layer LA in a cross section orthogonal to a direction (X-axis direction) in which rotator 1 is interposed between first torsion beam 21 and second torsion beam 22. A ratio of the vertical dimension (dimension in the Z-axis direction) of active layer LA to the horizontal dimension (dimension in the Y-axis direction) of active layer LA is less than 1. First support part 31 and second support part 32 include active layer LA common to rotator 1, first torsion beam 21, and second torsion beam 22. Rotator 1, first support part 31, and second support part 32 include a support layer LS. Rotator 1, first torsion beam 21, second torsion beam 22, first support part 31, and second support part 32 may include a common surface oxide film LOS, a common intermediate oxide film LO1, a common lower insulating film LI1, and a common upper insulating film LI2.

Reflector 10 is to reflect light. Reflector 10 is a metal film. Reflector 10 is desirably made of metal having a high reflectance at a wavelength of light to be scanned. The light to be scanned is, for example, infrared rays.

When the light to be scanned is infrared rays, reflector 10 is preferably a gold (Au) film. When reflector 10 is a gold (Au) film, reflector 10 desirably includes an adhesion layer (not illustrated). The adhesion layer (not illustrated) adheres to active layer LA. This may make adhesion between reflector 10 and active layer LA higher.

Reflector 10 including the adhesion layer (not illustrated) is formed by, for example, laminating a chromium (Cr) film, a nickel (Ni) film, and a gold (Au) film. Reflector 10 including the adhesion layer (not illustrated) is formed by, for example, laminating a titanium (Ti) film, a platinum (Pt) film, and a gold (Au) film.

For example, when optical scanning device 100 is packaged, optical scanning device 100 may be vacuum-encapsulated to make reflector 10 resistant to oxidation. For example, when optical scanning device 100 is packaged, optical scanning device 100 may be filled with an inert gas such as nitrogen (N2) to make reflector 10 resistant to oxidation. When reflector 10 is made resistant to oxidation, reflector 10 may be an aluminum (Al) film.

As illustrated in FIG. 1, reflector 10 is superposed on rotator 1. Rotator 1 is interposed between first torsion beam 21 and second torsion beam 22. Rotator 1 is rotatable with respect to first support part 31 and second support part 32 with first torsion beam 21 and second torsion beam 22 as a rotation axis.

As illustrated in FIG. 1, in the present embodiment, a direction in which reflector 10 is superposed on rotator 1 is the Z-axis direction. A direction from rotator 1 toward reflector 10 is a Z-axis positive direction. A direction from reflector 10 toward rotator 1 is a Z-axis negative direction. A direction in which rotator 1 is interposed between first torsion beam 21 and second torsion beam 22 is the X-axis direction. A direction from first torsion beam 21 toward second torsion beam 22 is an X-axis positive direction. A direction from second torsion beam 22 toward first torsion beam 21 is an X-axis negative direction. A direction orthogonal to both the X-axis direction and the Z-axis direction is the Y-axis direction. In the present embodiment, the X axis, the Y axis, and the Z axis constitute a right-handed system.

As illustrated in FIG. 1, a vertical dimension (dimension in the Z-axis direction) of first torsion beam 21 of optical scanning device 100 is less than or equal to a horizontal dimension (dimension in the Y-axis direction) of first torsion beam 21 of optical scanning device 100 in a cross section orthogonal to a direction (X-axis direction) in which rotator 1 is interposed between first torsion beam 21 and second torsion beam 22. A vertical dimension (dimension in the Z-axis direction) of second torsion beam 22 of optical scanning device 100 is less than or equal to a horizontal dimension (dimension in the Y-axis direction) of second torsion beam 22 of optical scanning device 100 in a cross section orthogonal to a direction (X-axis direction) in which rotator 1 is interposed between first torsion beam 21 and second torsion beam 22.

As illustrated in FIG. 2, first elastic layer 41 is superposed on first torsion beam 21. First elastic layer 41 is superposed on first torsion beam 21 from the Z-axis positive direction. First elastic layer 41 covers at least a part of first torsion beam 21. First elastic layer 41 extends in the X-axis direction. First elastic layer 41 may be disposed extending from first support part 31 to rotator 1. In the present embodiment, surface oxide film LOS is interposed between first elastic layer 41 and first torsion beam 21.

As illustrated in FIG. 2, second elastic layer 42 is superposed on second torsion beam 22. Second elastic layer 42 is superposed on second torsion beam 22 from the Z-axis positive direction. Second elastic layer 42 covers at least a part of second torsion beam 22. Second elastic layer 42 extends in the X-axis direction. Second elastic layer 42 may be disposed extending from second support part 32 to rotator 1. In the present embodiment, surface oxide film LOS is interposed between second elastic layer 42 and second torsion beam 22.

First elastic layer 41 and second elastic layer 42 are elastic. First elastic layer 41 and second elastic layer 42 are higher in fatigue life than metal. In the present embodiment, the fatigue life is the number of times stress is applied until a material to which the stress is repeatedly applied is broken. First elastic layer 41 and second elastic layer 42 may be higher in fatigue life than, for example, aluminum (Al) and an aluminum (Al)-based alloy. The aluminum (Al)-based alloy is, for example, an aluminum-silicon (Al—Si) alloy. First elastic layer 41 and second elastic layer 42 are higher in fatigue life than a metal wiring member. Further, first elastic layer 41 and second elastic layer 42 are higher in elastic limit than metal.

Even when strain is generated by stress applied to first elastic layer 41 and second elastic layer 42, first elastic layer 41 and second elastic layer 42 are to eliminate the strain in response to elimination of the stress. That is, even when first elastic layer 41 and second elastic layer 42 become deformed, first elastic layer 41 and second elastic layer 42 are to return to their original shapes in response to the elimination of the stress. Note that, when stress exceeding the elastic limit is applied to first elastic layer 41 and second elastic layer 42, first elastic layer 41 and second elastic layer 42 do not return to their original shapes even if the stress is eliminated.

As illustrated in FIG. 2, their respective dimensions of first torsion beam 21, second torsion beam 22, first elastic layer 41, and second elastic layer 42 in the Y-axis direction are smaller than the dimension of rotator 1 in the Y-axis direction. First torsion beam 21 and first elastic layer 41 serve as a torsion spring. Second torsion beam 22 and second elastic layer 42 serve as a torsion spring.

A material of first elastic layer 41 and second elastic layer 42 is an elastic material higher in fatigue life higher than metal. The material of first elastic layer 41 and second elastic layer 42 contains, for example, silicon (Si). The material of first elastic layer 41 and second elastic layer 42 contains, for example, polysilicon. Note that, in the present embodiment, polysilicon is polycrystalline silicon. The material of first elastic layer 41 and second elastic layer 42 contains, for example, monocrystalline silicon. First elastic layer 41 and second elastic layer 42 may be made of, for example, a wafer (silicon wafer) made of silicon (Si). The material of first elastic layer 41 and second elastic layer 42 contains, for example, amorphous silicon.

As illustrated in FIG. 2, first torsion beam 21 is interposed between first support part 31 and rotator 1. First support part 31 supports first torsion beam 21. Second torsion beam 22 is interposed between second support part 32 and rotator 1. Second support part 32 supports second torsion beam 22. First support part 31 and second support part 32 are to not rotate when rotator 1, first torsion beam 21, and second torsion beam 22 rotate. First support part 31 and second support part 32 are fixed to a table (not illustrated), for example. The table (not illustrated) is disposed, for example, in the Z-axis negative direction relative to first support part 31 and second support part 32.

As illustrated in FIG. 2, first metal wiring 61 extends from first support part 31 to rotator 1 via first torsion beam 21. Second metal wiring 62 extends from second support part 32 to rotator 1 via second torsion beam 22. First metal wiring 61 and second metal wiring 62 are disposed along upper insulating film LI2 (see FIG. 3). First metal wiring 61 and second metal wiring 62 are made of metal having high electrical conductivity. Examples of the material of first metal wiring 61 and second metal wiring 62 include aluminum (Al), aluminum nitride (AlN), and the like.

As illustrated in FIG. 2, rotator 1 includes coil wiring 5. Coil wiring 5 is superposed on active layer LA. Coil wiring 5 includes wiring extending in the X-axis direction. Coil wiring 5 has, for example, a spiral shape. First metal wiring 61 and second metal wiring 62 are electrically connected to coil wiring 5. Coil wiring 5 is made of metal having high electrical conductivity. Examples of the material of coil wiring 5 include aluminum (Al), aluminum nitride (AlN), and the like. A current flowing through coil wiring 5 at least partly flows in the X-axis direction.

As illustrated in FIG. 2, magnet M is disposed apart from rotator 1. Magnet M is, for example, a permanent magnet. Magnet M includes a first magnet M1 and a second magnet M2. Rotator 1 is interposed between first magnet M1 and second magnet M2 with a gap provided between rotator 1, and first magnet M1 and second magnet M2. Rotator 1 is interposed between first magnet M1 and second magnet M2 in the Y-axis direction. A magnetic field generated from magnet M has a magnetic field in the Y-axis direction. Second magnet M2 is disposed in the Y-axis positive direction relative to first magnet M1.

Rotator 1 is to be rotated by Lorentz force, electrostatic force, or the like. In the present embodiment, rotator 1 is to be rotated by Lorentz force generated by the current flowing through coil wiring 5 and magnetic force generated from magnet M. When the current flows through coil wiring 5, the current flows in the X-axis direction. The Lorentz force in the Z-axis direction is generated in coil wiring 5 by the current flowing through coil wiring 5 in the X-axis direction and the magnetic field generated by magnet M in the Y-axis direction. This causes a force in the Z-axis direction to act on coil wiring 5 of rotator 1. This generates, in rotator 1, rotational torque about first torsion beam 21 and second torsion beam 22. This in turn causes rotator 1 to rotate about first torsion beam 21 and second torsion beam 22 relative to the support parts.

With reference to FIG. 3, a description will be given below in detail of configurations of active layer LA, support layer LS, and the like according to the first embodiment.

As illustrated in FIG. 3, support layer LS, intermediate oxide film LOI, active layer LA, surface oxide film LOS, lower insulating film LI1, and upper insulating film LI2 are laminated in this order.

Support layer LS extends in an in-plane direction (along a plane formed by the X axis and the Y axis). Support layer LS is larger in dimension in the thickness direction (Z-axis direction) than active layer LA. The material of support layer LS contains, for example, silicon (Si). Support layer LS includes a first support layer 1S, a second support layer 31S, and a third support layer 32S. First support layer 1S, second support layer 31S, and third support layer 32S are arranged apart from each other.

Intermediate oxide film LOI is directly laminated on support layer LS in the Z-axis direction. The material of intermediate oxide film LOI contains, for example, silicon (Si). Intermediate oxide film LOI includes a first intermediate oxide film 1OI, a second intermediate oxide film 31OI, and a third intermediate oxide film 32OI. First intermediate oxide film 1OI, second intermediate oxide film 31OI, and third intermediate oxide film 32OI are arranged apart from each other.

Active layer LA is directly laminated on intermediate oxide film LOI in the Z-axis direction. Active layer LA may be uniform in dimension in the Z-axis direction. Oxide films are provided on both sides of active layer LA. The material of active layer LA contains, for example, silicon (Si). The material of active layer LA contains, for example, monocrystalline silicon. Active layer LA is made of, for example, a monocrystalline silicon wafer.

Active layer LA includes a first active layer 1A, a second active layer 31A, a third active layer 32A, a fourth active layer 21A, and a fifth active layer 22A. First active layer 1A, second active layer 31A, third active layer 32A, fourth active layer 21A, and fifth active layer 22A are integrally formed. First active layer 1A is interposed between fourth active layer 21A and fifth active layer 22A in the in-plane direction. Fourth active layer 21A is interposed between first active layer 1A and second active layer 31A in the in-plane direction. Fifth active layer 22A is interposed between first active layer 1A and third active layer 32A in the in-plane direction.

Surface oxide film LOS is directly laminated on active layer LA in the Z-axis direction. Surface oxide film LOS may be uniform in dimension in the Z-axis direction. First elastic layer 41 and second elastic layer 42 are directly laminated on surface oxide film LOS. The material of surface oxide film LOS contains, for example, silicon (Si).

Surface oxide film LOS includes a first surface oxide film 1OS, a second surface oxide film 31OS, a third surface oxide film 32OS, a fourth surface oxide film 21OS, and a fifth surface oxide film 22OS. First surface oxide film 1OS, second surface oxide film 31OS, third surface oxide film 32OS, fourth surface oxide film 21OS, and fifth surface oxide film 22OS are integrally formed. First surface oxide film 1OS is interposed between fourth surface oxide film 21OS and fifth surface oxide film 22OS in the in-plane direction. Fourth surface oxide film 21OS is interposed between first surface oxide film 1OS and second surface oxide film 31OS in the in-plane direction. Fifth surface oxide film 22OS is interposed between first surface oxide film 1OS and third surface oxide film 32OS in the in-plane direction.

Lower insulating film LI1 is directly laminated on active layer LA, first elastic layer 41, and second elastic layer 42 in the Z-axis direction. Coil wiring 5 is disposed on lower insulating film LI1. Lower insulating film LI1 is, for example, an oxide film, an organic film, or the like.

Lower insulating film LI1 includes a first lower insulating film 1I1, a second lower insulating film 31I1, a third lower insulating film 32I1, a fourth lower insulating film 21I1, and a fifth lower insulating film 22I1. First lower insulating film 1I1, second lower insulating film 31I1, third lower insulating film 32I1, fourth lower insulating film 21I1, and fifth lower insulating film 22I1 are integrally formed. First lower insulating film 1I1 is interposed between fourth lower insulating film 21I1 and fifth lower insulating film 22I1 in the in-plane direction. Fourth lower insulating film 21I1 is interposed between first lower insulating film 1I1 and second lower insulating film 31I1 in the in-plane direction. Fifth lower insulating film 22I1 is interposed between first lower insulating film 1I1 and third lower insulating film 32I1 in the in-plane direction.

Upper insulating film LI2 is directly laminated on lower insulating film LI1 and coil wiring 5. Reflector 10 is disposed on upper insulating film 1I2. First metal wiring 61 and second metal wiring 62 are disposed on upper insulating film LI2. A distance between upper insulating film LI2 and surface oxide film LOS in the Z-axis direction may be uniform. Upper insulating film LI2 is, for example, an oxide film, an organic film, or the like.

Upper insulating film LI2 includes a first upper insulating film 1I2, a second upper insulating film 31I2, a third upper insulating film 32I2, a fourth upper insulating film 21I2, and a fifth upper insulating film 22I2. First upper insulating film 1I2, second upper insulating film 31I2, third upper insulating film 32I2, fourth upper insulating film 21I2, and fifth upper insulating film 22I2 are integrally formed. First upper insulating film 1I2 is interposed between fourth upper insulating film 21I2 and fifth upper insulating film 22I2 in the in-plane direction. Fourth upper insulating film 21I2 is interposed between first upper insulating film 1I2 and second upper insulating film 31I2 in the in-plane direction. Fifth upper insulating film 22I2 is interposed between first upper insulating film 1I2 and third upper insulating film 32I2 in the in-plane direction.

As illustrated in FIG. 3, rotator 1 includes first support layer 1S, first intermediate oxide film 1O1, first active layer 1A, first surface oxide film 1OS, first lower insulating film 1I1, and first upper insulating film 1I2. First support layer 1S, first intermediate oxide film 1OI, first active layer 1A, first surface oxide film 1OS, first lower insulating film 1LI1, and first upper insulating film 1I2 are laminated in this order.

First torsion beam 21 includes fourth active layer 21A, fourth surface oxide film 21OS, fourth lower insulating film 21I1, and fourth upper insulating film 21I2. Fourth active layer 21A, fourth surface oxide film 21OS, first elastic layer 41, fourth lower insulating film 21I1, and fourth upper insulating film 21I2 are laminated in this order.

Second torsion beam 22 includes fifth active layer 22A, fifth surface oxide film 22OS, fifth lower insulating film 22I1, and fifth upper insulating film 22I2. Fifth active layer 22A, fifth surface oxide film 22OS, second elastic layer 42, fifth lower insulating film 22I1, and fifth upper insulating film 22I2 are laminated in this order.

First support part 31 includes second support layer 31S, second intermediate oxide film 31OI, second active layer 31A, second surface oxide film 31OS, second lower insulating film 31I1, and second upper insulating film 31I2. Second support layer 31S, second intermediate oxide film 31OI, second active layer 31A, second surface oxide film 31OS, second lower insulating film 31I1, and second upper insulating film 31I2 are laminated in this order.

Second support part 32 includes third support layer 32S, third intermediate oxide film 32OI, third active layer 32A, third surface oxide film 32OS, third lower insulating film 32I1, and third upper insulating film 32I2. Third support layer 32S, third intermediate oxide film 32OI, third active layer 32A, third surface oxide film 32OS, third lower insulating film 32I1, and third upper insulating film 32I2 are laminated in this order.

Figure 4:
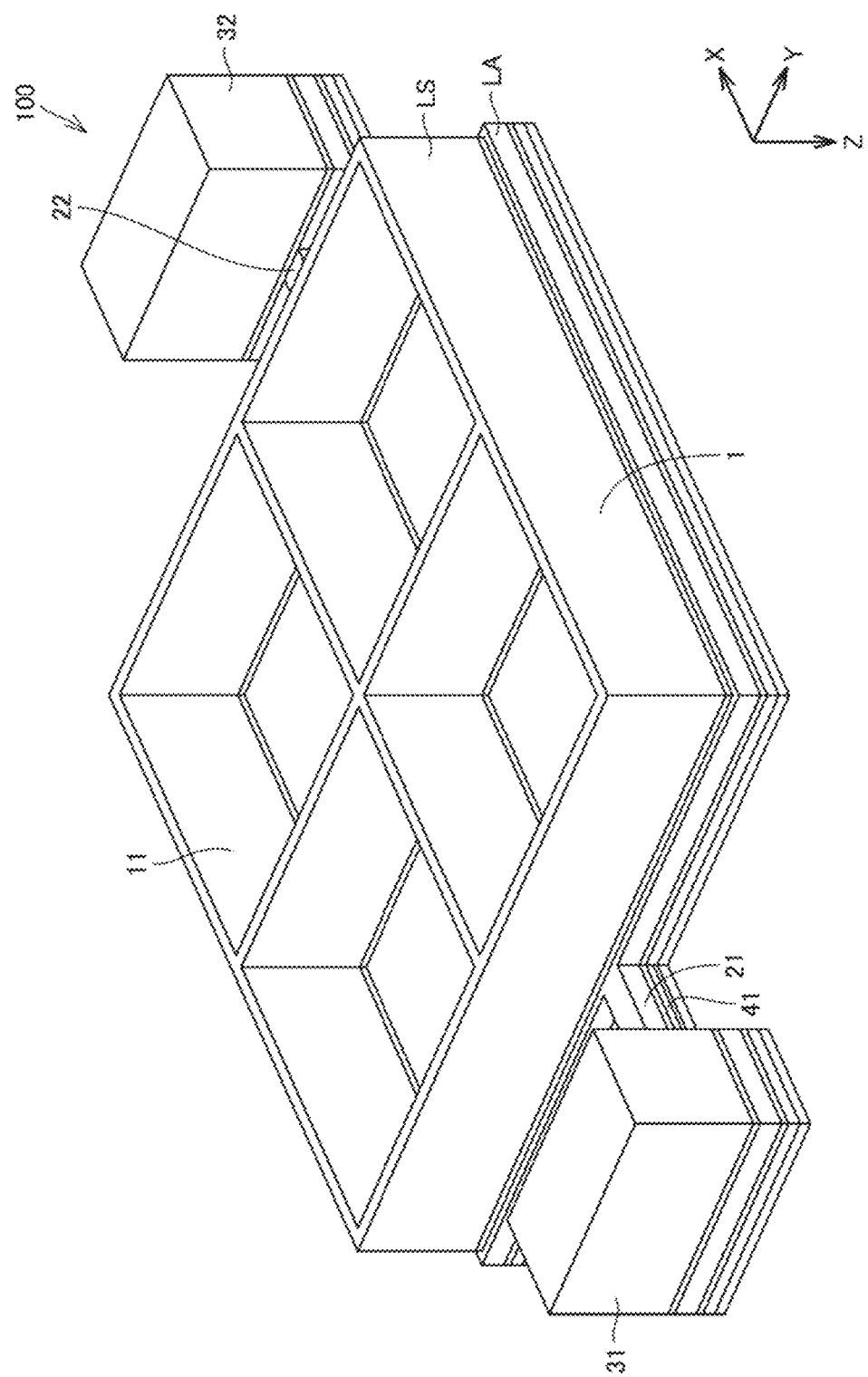
FIG. 4 is a schematic perspective view of a configuration of an optical scanning device according to a first modification of the first embodiment.

With reference to FIG. 4, a description will be given below of a configuration of optical scanning device 100 according to a first modification of the first embodiment.

As illustrated in FIG. 4, rotator 1 includes a recess 11. Recess 11 is open to an opposite side to reflector 10 (see FIG. 1) with respect to active layer LA. Recess 11 is open in the Z-axis negative direction. In the present embodiment, recess 11 is provided in support layer LS. In the present embodiment, support layer LS is partially hollow. Rotator 1 is lighter than rotator 1 having solid support layer LS. Rotator 1 has a rib structure extending in the Z-axis direction. Support layer LS may be smaller in dimension in the X-axis direction than active layer LA. Support layer LS may be smaller in dimension in the V-axis direction than active layer LA.

Figure 5:
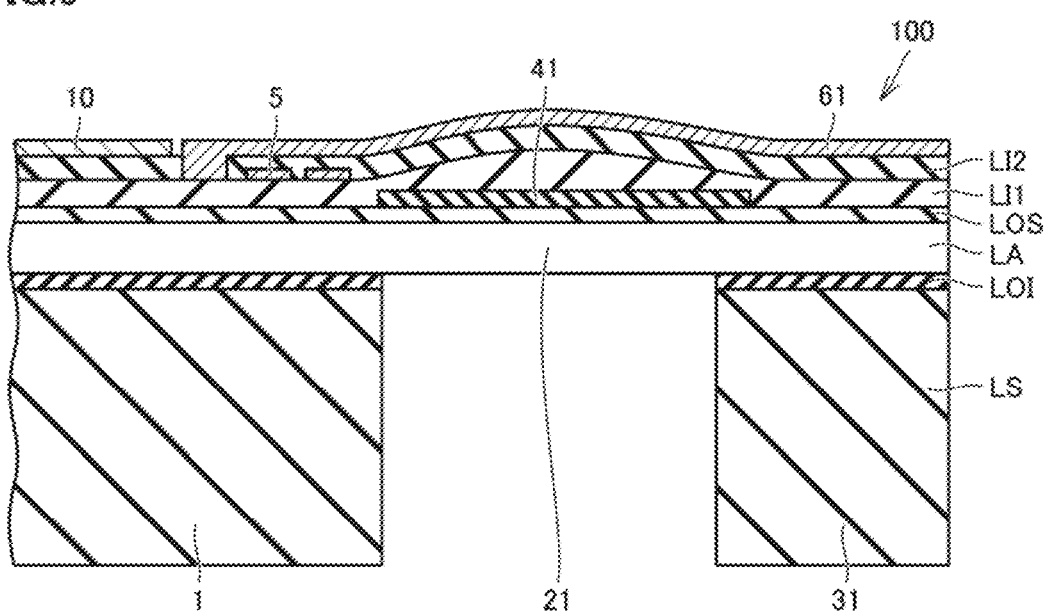
FIG. 5 is a schematic cross-sectional view of a configuration of an optical scanning device according to a second modification of the first embodiment.

With reference to FIG. 5, a description will be given below of a configuration of optical scanning device 100 according to a second modification of the first embodiment. In the second modification of the first embodiment, lower insulating film LI1 is curved upward in the Z-axis positive direction by first elastic layer 41 and the second elastic layer 42. Upper insulating film LI2 is curved upward in the Z-axis positive direction along the upward curve of lower insulating film LI1. A first metal wiring 61 and a second metal wiring 62 are disposed along the upward curve of lower insulating film LI1 and the upward curve of upper insulating film LI2. This causes first lead wiring 71 and second lead wiring to deform in the Z-axis positive direction.

With reference to FIGS. 3 and 6 to 10, a description will be given below of a method for manufacturing optical scanning device 100 according to the first embodiment. The method for manufacturing optical scanning device 100 includes a preparing step, a providing step, a laminating step, and a forming step.

Figure 6:
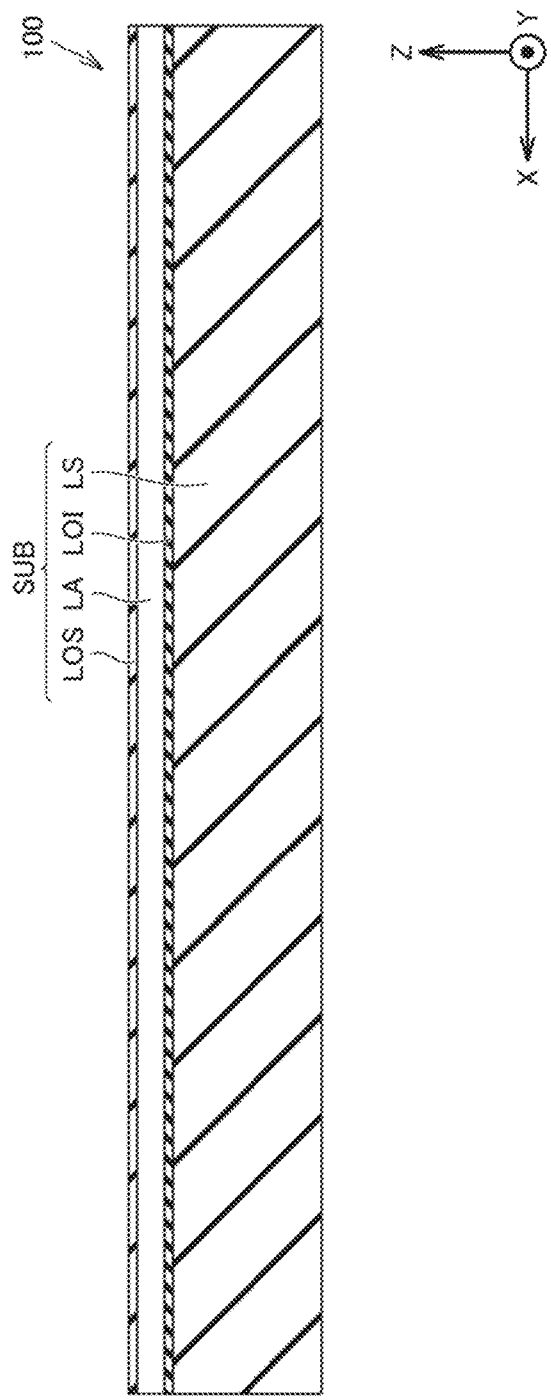
FIG. 6 is a schematic cross-sectional view of the optical scanning device according to the first embodiment in a preparing step.

As illustrated in FIG. 6, in the preparing step, a substrate SUB is prepared. Substrate SUB is, for example, a silicon on insulator (SOI) substrate. Substrate SUB includes active layer LA and support layer LS. Substrate SUB may include surface oxide film LOS and intermediate oxide film LOI. Active layer LA and support layer LS are laminated. Surface oxide film LOS, active layer LA, intermediate oxide film LOI, and support layer LS are laminated in this order.

Figure 7:
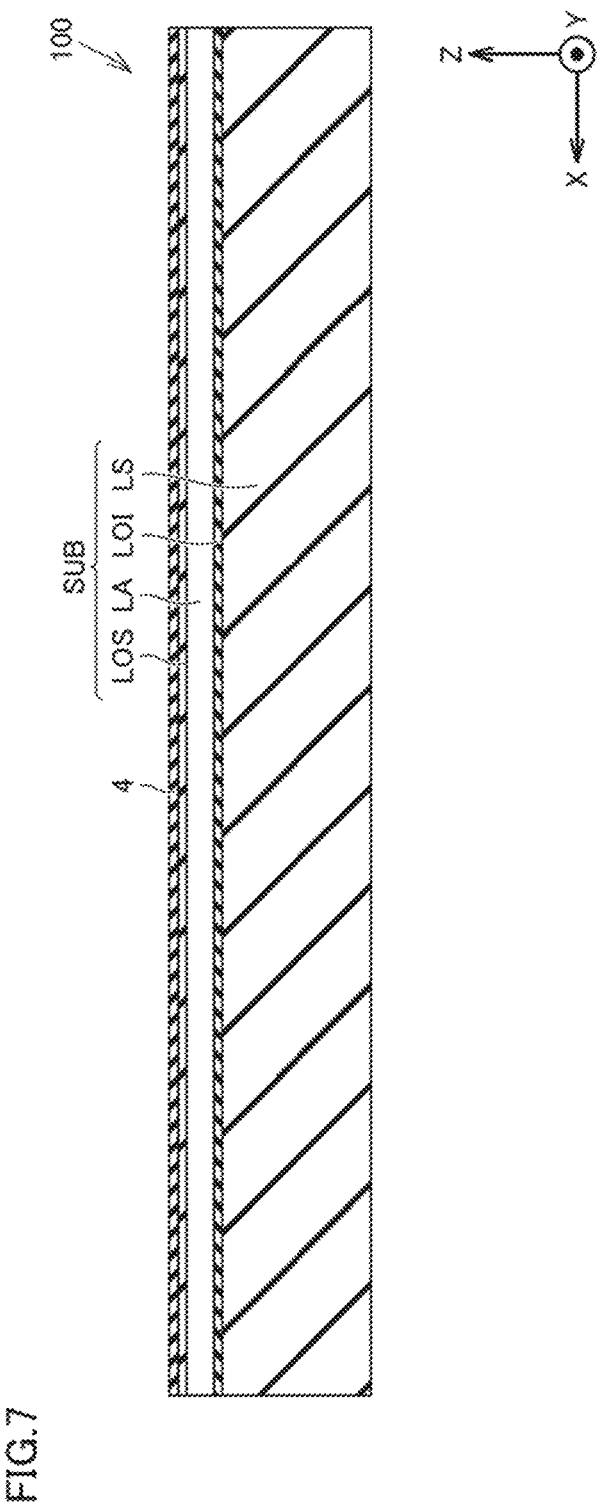
FIG. 7 is a schematic cross-sectional view of a substrate on which an elastic material is superposed according to the first embodiment.

Subsequently, as illustrated in FIG. 7, an elastic layer 4 is provided on an opposite side to support layer LS with respect to active layer LA of substrate SUB. Elastic layer 4 is an elastic material higher in fatigue life than metal. Elastic layer 4 contains, for example, silicon (Si) as a material.

In the present embodiment, elastic layer 4 is formed on surface oxide film LOS. Elastic layer 4 may be formed by, for example, chemical vapor deposition (CVD) or the like. When elastic layer 4 is a wafer made of silicon (Si), elastic layer 4 may be bonded onto surface oxide film LOS by, for example, room-temperature activated bonding, plasma activated bonding, or the like.

Figure 8:
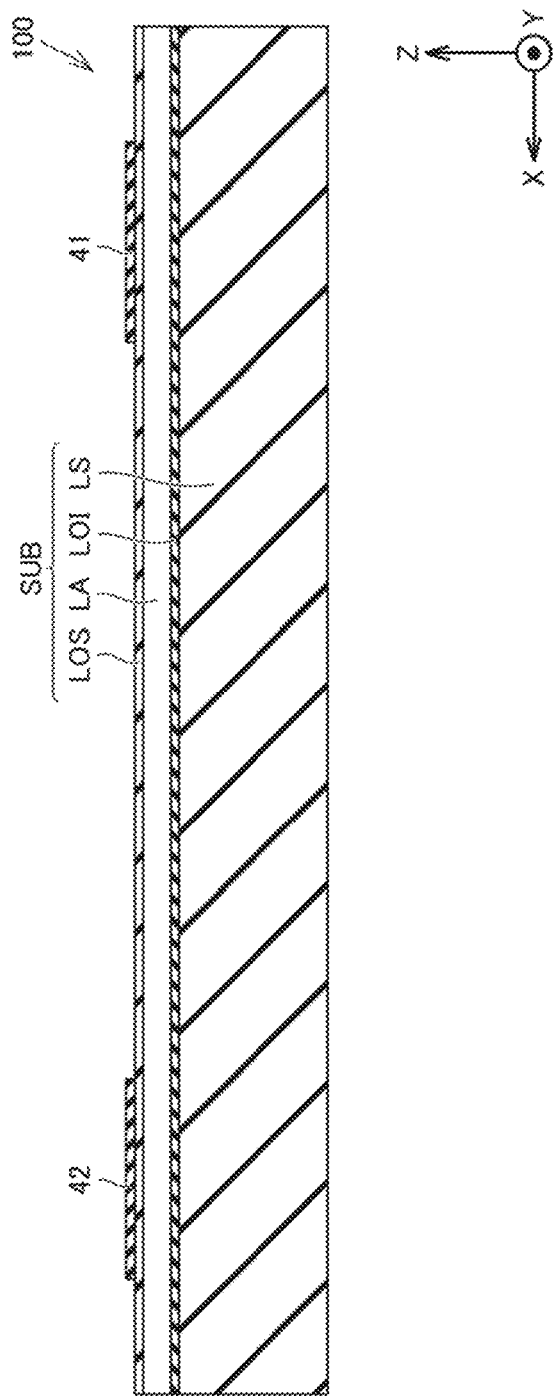
FIG. 8 is a schematic cross-sectional view of the optical scanning device according to the first embodiment in a providing step.

Subsequently, as illustrated in FIG. 8, in the providing step, first elastic layer 41 is provided on the opposite side to support layer LS with respect to active layer LA of substrate SUB. In the providing step, second elastic layer 42 is provided, apart from first elastic layer 41, on the opposite side to support layer LS with respect to active layer LA of substrate SUB. First elastic layer 41 is an elastic material higher in fatigue life than metal. First elastic layer 41 contains, for example, silicon (Si) as a material. Second elastic layer 42 is an elastic material higher in fatigue life higher than metal. Second elastic layer 42 contains, for example, silicon (Si) as a material.

In the providing step, specifically, the elastic material is partially removed to provide first elastic layer 41 and second elastic layer 42. The elastic material is partially removed, for example, by etching and patterning. The elastic material disposed on surface oxide film LOS may be etched and patterned on surface oxide film LOS. Shaping the elastic material into a required shape to provide first elastic layer 41 and second elastic layer 42.

The elastic material may be etched by, for example, wet etching using an etchant or dry etching such as reactive ion etching (RIE). Etching conditions are selected so as to obtain high selectivity between first elastic layer 41 and second elastic layer 42, and surface oxide film LOS.

First elastic layer 41 and second elastic layer 42 may be preferably patterned by a photolithography technique using a resist film (not illustrated) as a protective film. The resist film (not illustrated) is removed by O2 ashing or the like, for example.

Figure 9:
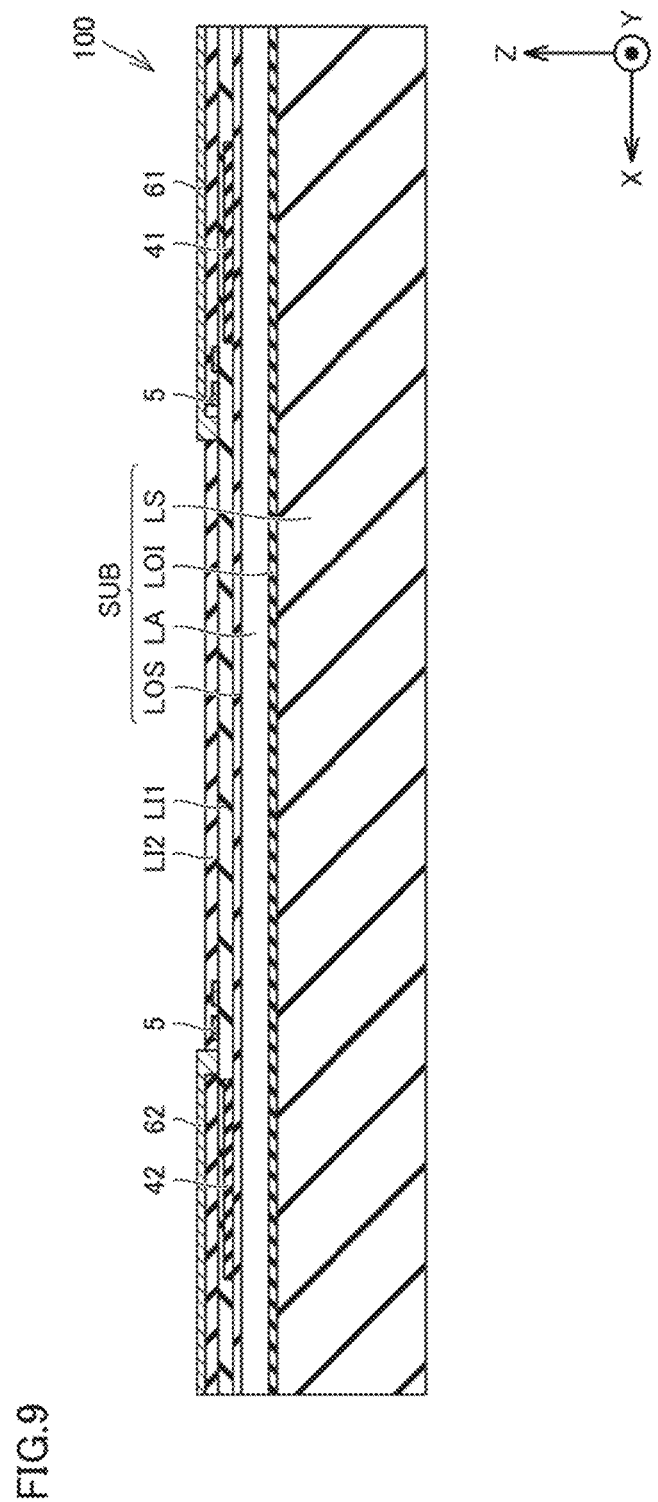
FIG. 9 is a schematic cross-sectional view of the optical scanning device according to the first embodiment in which coil wiring and the like are disposed.

As illustrated in FIG. 9, lower insulating film LI1 is formed on surface oxide film LOS, first elastic layer 41, and second elastic layer 42. Upper insulating film LI2 is formed on lower insulating film LI1. Upper insulating film LI2 may be formed on lower insulating film LI1 by the same method as for lower insulating film LI1.

As illustrated in FIG. 9, coil wiring 5 is disposed on lower insulating film LI1. Coil wiring 5 is disposed so as to be at least partially exposed from upper insulating film LI2. Coil wiring 5 is formed on lower insulating film LI1 by sputtering or the like. Coil wiring 5 thus formed may be etched and patterned. This causes formed coil wiring 5 to change into a required shape.

Coil wiring 5 disposed on lower insulating film LI1 may be etched by, for example, wet etching using an etchant or dry etching such as reactive ion etching (RIE). The etching conditions are selected so as to obtain high selectivity between coil wiring 5 and lower insulating film LI1. Coil wiring 5 may be preferably patterned by a photolithography technique using a resist film (not illustrated) as a protective film.

First metal wiring 61 and second metal wiring 62 are disposed on upper insulating film LI2. First metal wiring 61 and second metal wiring 62 are electrically connected to coil wiring 5. First metal wiring 61 and second metal wiring 62 may be disposed on upper insulating film LI2 by the same method as for coil wiring 5.

Figure 10:
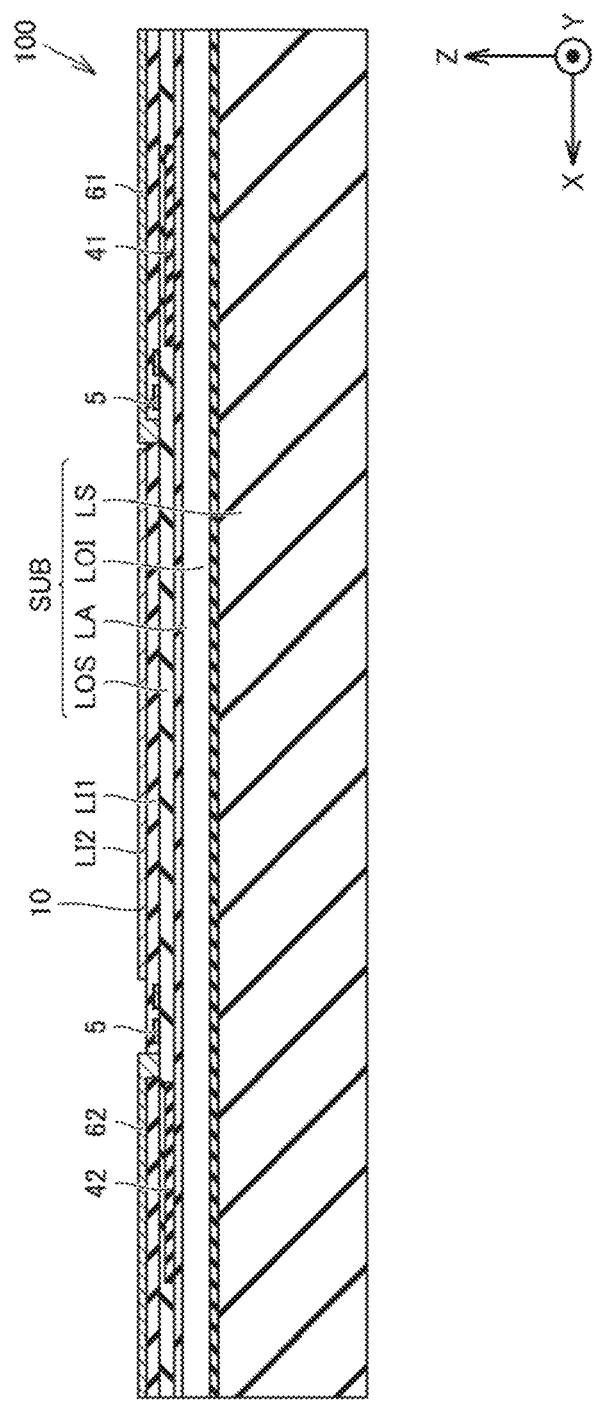
FIG. 10 is a schematic cross-sectional view of the optical scanning device according to the first embodiment in a laminating step.

As illustrated in FIG. 10, in the laminating step, reflector 10 is laminated on active layer LA between first elastic layer 41 and second elastic layer 42. Reflector 10 is to reflect light. Reflector 10 is formed on upper insulating film LI2 by sputtering or the like. Reflector 10 thus formed may be etched and patterned. This causes formed reflector 10 to change into a required shape. Reflector 10 disposed on upper insulating film LI2 may be etched by, for example, wet etching using an etchant or dry etching such as reactive ion etching (RIE). The etching conditions are selected so as to obtain high selectivity between reflector 10 and upper insulating film LI2. Reflector 10 may be preferably patterned by a photolithography technique using a resist film (not illustrated) as a protective film.

Subsequently, as illustrated in FIGS. 10 and 3, in the forming step, support layer LS is removed on an opposite side to first elastic layer 41 with respect to active layer LA to form first torsion beam 21. In the forming step, support layer LS is removed on an opposite side to second elastic layer 42 with respect to active layer LA to form second torsion beam 22. A vertical dimension (dimension in the Z-axis direction) of active layer LA is smaller than a horizontal dimension (dimension in the Y-axis direction) of active layer LA in a cross section orthogonal to a direction (X-axis direction) in which rotator 1 is interposed between first torsion beam 21 and second torsion beam 22. First torsion beam 21 and second torsion beam 22 are formed, and rotator 1, first support part 31, and second support part 32 are formed accordingly. Rotator 1 is interposed between first torsion beam 21 and second torsion beam 22. Reflector 10 is superposed on rotator 1.

Support layer LS is removed by, for example, patterning. Specifically, after support layer LS is patterned on an opposite side to reflector 10 with respect to active layer LA, and then intermediate oxide film LO1 is patterned. Although not illustrated, surface oxide film LOS and active layer LA may be patterned on an opposite side to support layer LS with respect to active layer LA. Support layer LS and intermediate oxide film LOI may be preferably patterned by a photolithography technique using a resist film (not illustrated) as a protective film.

Intermediate oxide film LOI may be etched by, for example, wet etching using an etchant or dry etching such as reactive ion etching (RIE). When intermediate oxide film LOI is etched by RIE, a CI4 gas is preferably used as an etchant.

Support layer LS and active layer LA are desirably etched by deep reactive ion etching (DRIE) using the Bosch process. This allows support layer LS and active layer LA to be etched with a high aspect ratio. After support layer LS and active layer LA are etched, the resist film is removed. Note that, in the present embodiment, the aspect ratio is a ratio between an etching depth and an etching width.

Next, a description will be given of a trade-off between the hard spring effect and the maximum deflection angle with reference to an optical scanning device according to a comparative example. Note that the hard spring effect is an effect of making a peak frequency higher. The appearance of the hard spring effect makes it difficult to control the rotation of rotator 1. The maximum deflection angle is a maximum angle by which rotator 1 can rotate. This larger the maximum deflection angle, the more rotator 1 can rotate, so that reflector 10 can reflect light in a wide range.

The hard spring effect (HSE) is caused by tensile stress generated by expansion and contraction in a longitudinal direction when the beam is twisted, and tends to become larger as a dimensional ratio between the width of the beam and the thickness of the beam deviates from 1. It is therefore necessary to avoid a shape having a small thickness and a large width.

On the other hand, in order to increase the maximum deflection angle of the rotator, it is necessary to reduce the thickness of the active layer. This is because the maximum deflection angle is inversely proportional to the moment of inertia of the rotator. When the active layer is thin, it is necessary to increase the width of the beam to increase the spring constant, so as to maintain a desired resonance frequency. Therefore, the thinner the beam, the more the aspect ratio of the cross section of the beam deviates from 1, so that the hard spring effect tends to become larger. Conversely, when the active layer is increased in thickness, the hard spring effect can be reduced, but the maximum deflection angle decreases.

As described above, with the beam having a small thickness and a large width, the intensity of the hard spring effect and the maximum deflection angle are in a trade-off relationship, and in the MEMS mirror (optical scanning device 100) as in the typical related art, the deflection angle may be limited by an increase in HSE.

The optical scanning device according to the comparative example does not include first elastic layer 41, second elastic layer 42, surface oxide film LOS, lower insulating film LI1, and upper insulating film LI2. The optical scanning device according to the comparative example is different from optical scanning device 100 according to the first embodiment mainly in that first elastic layer 41 and second elastic layer 42 are not included.

The optical scanning device according to the comparative example includes recess 11. The optical scanning device according to the comparative example includes a surface layer laminated on active layer LA.

In the present embodiment, a beam thickness is a dimension of first torsion beam 21 and second torsion beam 22 in the Z-axis direction of optical scanning device 100. A beam width is a dimension of first torsion beam 21 and second torsion beam 22 in the Y-axis direction of optical scanning device 100. An aspect ratio is a ratio of the beam width to the beam thickness (beam width/beam thickness).

As described above, the hard spring effect is related to the aspect ratio. The closer the aspect ratio is to 1, the larger the hard spring effect. Since the beam thickness is smaller than the beam width, the aspect ratio is larger than 1. In a range where the beam thickness is less than or equal to the beam width, the larger the beam thickness, the closer the aspect ratio is to 1. Therefore, the larger the beam thickness, the smaller the hard spring effect. Therefore, the larger the beam thickness, the more the hard spring effect can be reduced.

The relationship between the beam thickness and the maximum deflection angle is formulated. Subsequently, the relationship between the beam thickness and the aspect ratio is formulated, and the trade-off relationship between the magnitude of the maximum deflection angle and the reduction of the hard spring effect is shown. A resonance frequency fc of rotator 1 is expressed by the following Equation (1).

[Math. 1]
$$f_c = \frac{1}{2\pi}\sqrt{k_0/I_0} \quad (1)$$

Moment of inertia I0 of rotator 1 is the sum of moment of inertia Ia of active layer LA and moment of inertia Is of support layer LS. Therefore, moment of inertia I0 of rotator 1 is expressed by the following Equation (2).

(Math. 2)

$$I_0 = I_s + I_a \quad (2)$$

Active layer LA is assumed to be a flat plate. Therefore, when the thickness of active layer LA is multiplied by α, moment of inertia I of rotator 1 is expressed by the following Equation (3).

[Math. 3]

$$I = I_s + \alpha I_a \quad (3)$$

A torsion spring constant k of first torsion beam 21 and second torsion beam 22 when the thickness of active layer LA is multiplied by a is expressed by the following Equation (4) using Equations (1) and (3).

[Math. 4]
$$k = \frac{I}{I_0}k_0 = \frac{I_s + \alpha I_a}{I_s + I_a}k_0 \quad (4)$$

Torsion spring constant k and maximum deflection angle θ are inversely proportional to each other. Therefore, referring to deflection angle θ0 with α=1, maximum deflection angle θ is expressed by the following Equation (5).

[Math. 5]
$$\theta = \frac{I_s + I_a}{I_s + \alpha I_a}\theta_0 \quad (5)$$

Torsion spring constant k is expressed by the following Equation (6) using Young's modulus E and the Poisson's ratio γ. Note that a in Equation (6) is expressed by the following Equation (7).

[Math. 6]
$$k = \frac{2aGwt^3}{L} = \frac{aEwt^3}{L(1+\gamma)} \quad (6)$$

[Math. 7]
$$a = \frac{1}{3}\left(1 - \frac{192}{\pi^5}\frac{t}{w}\tanh\left(\frac{\pi w}{2t}\right)\right) \quad (7)$$

From Equations (4) and (6), a beam width w when a beam thickness t=α*t0 is expressed by the following Equation (8) when beam thickness t is smaller than beam width w.

[Math. 8]
$$w = \frac{I_s + \alpha I_a}{I_s + I_a}(w_0 - 0.63t_0)\frac{1}{\alpha^3} + 0.63\alpha t_0 \quad (8)$$

From Equation (8), a ratio between beam width w and beam thickness t is expressed by the following Equation (9).

[Math. 9]
$$w/\alpha t_0 = \frac{I_s + \alpha I_a}{I_s + I_a}(w_0 - 0.63t_0)\frac{1}{\alpha^4 t_0} + 0.63 \quad (9)$$

As shown in Equations (5) and (9), when the ratio of moment of inertia Ia of active layer LA to total moment I of rotator 1 is high, the maximum deflection angle and the aspect ratio greatly change in a manner that depends on a change in the thickness of active layer LA.

Subsequently, with reference to a first comparative example and a second comparative example, changes in the maximum deflection angle and the aspect ratio caused by a change in the thickness of active layer LA are calculated. Table I shows parameters of the first comparative example and the second comparative example.

TABLE 1

| Parameter | First comparative example | Second comparative example |
|---|---|---|
| Density of silicon | 2331 kg/m³ | |
| Width of rotator | 2500 μm | |
| Length of rotator | 2500 μm | |
| Thickness of support layer | 200 μm | |
| Rib width | 20 μm | |
| α | 1 | 1.33 |
| Thickness of active layer | 15 μm | 20 μm |
| Beam width | 500 μm | 276 μm |

In the first comparative example and the second comparative example, the density of silicon (Si) is 2331 (kg/m3). The width of rotator 1 is 2500 μm. The length of rotator 1 is 2500 μm. A rib width D (see FIG. 12) is 20 μm. The thickness of support layer LS is 200 μm.

In the first comparative example, a is 1. The thickness of active layer LA is 15 μm. The beam width is 500 μm. The aspect ratio is 33.3. In the second comparative example, α is 1.33. The thickness of active layer LA is 20 μm. The beam width is 276 μm. The aspect ratio is 13.8.

In the first comparative example and the second comparative example, the moment of inertia was calculated on the basis of the above-described dimensions and the like. As a changes, the thickness of active layer LA and beam width change. As a increases, the thickness of active layer LA increases.

Figure 11:
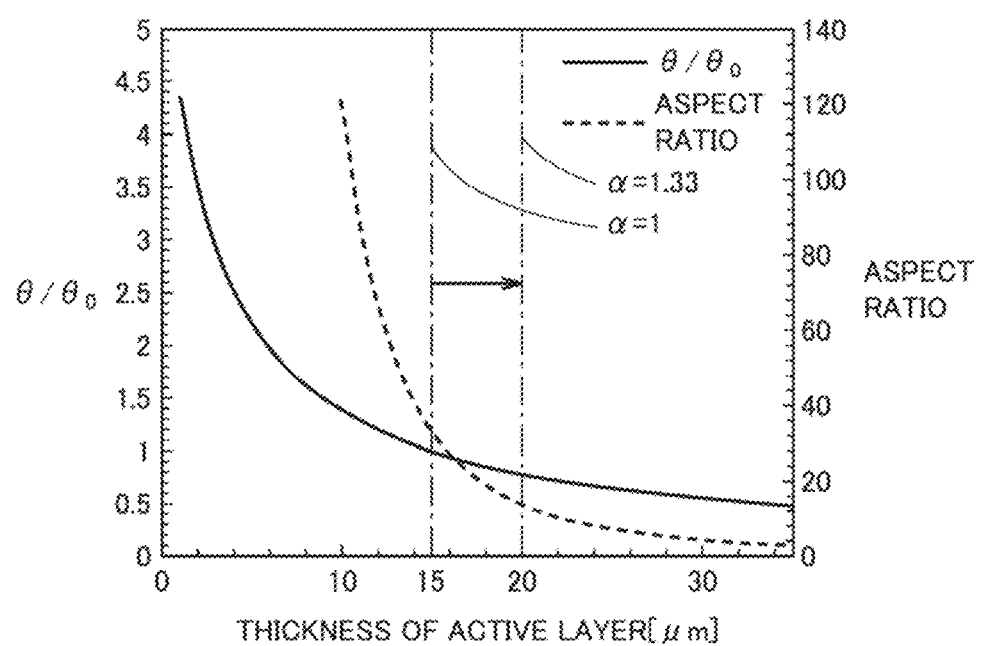
FIG. 11 is a graph showing a relationship between a thickness of an active layer and θ/θ0 and a relationship between the thickness of the active layer and an aspect ratio.

FIG. 11 is a graph showing the relationship between the thickness of active layer LA and θ/θ0 using a first axis on the left side of FIG. 11, and the relationship between the thickness of active layer LA and the aspect ratio using a second axis on the right side of FIG. 11. As shown in FIG. 11, in a range where the beam width is larger than the beam thickness (a range where the aspect ratio is larger than 1), the larger the maximum deflection angle, the larger the aspect ratio. Therefore, the larger the maximum deflection angle, the more the hard spring effect is likely to appear. Therefore, the magnitude of the maximum deflection angle and the reduction of the hard spring effect are in a trade-off relationship.

In the second comparative example, a is larger than in the first comparative example. The aspect ratio is smaller than in the first comparative example. The aspect ratio is closer to 1 than in the first comparative example. Therefore, in the second comparative example, the appearance of the hard spring effect can be reduced as compared with the first comparative example. In the second comparative example, however, the maximum deflection angle is smaller than in the first comparative example by at least 20%.

Therefore, in order to curb a decrease in the maximum deflection angle and to reduce the appearance of the hard spring effect, it is necessary to curb an increase in the thickness of first active layer 1A of rotator 1 and to increase the dimension (beam thickness) of first torsion beam 21 and second torsion beam 22 of optical scanning device 100.

In the present embodiment, since the thickness of active layer LA is not changed, α=1 is satisfied, and thus, moment of inertia I of rotator 1 is I=I0 from Equations (2) and (3). Therefore, according to Equation (5), the maximum deflection angle is θ=θ0.

Further, the aspect ratio (beam width/beam thickness) when only the beam thickness is multiplied by a using first elastic layer 41 and second elastic layer 42 without changing moment of inertia I0 of the rotator is expressed by the following Equation (10).

[Math. 10]

$$w/\alpha t_0 = (w_0 - 0.63 t_0)\frac{1}{\alpha^4 t_0} + 0.63 \tag{10}$$

As shown in Equation (10), the larger α (beam thickness), the smaller the aspect ratio (beam width/beam thickness). That is, the aspect ratio (beam width/beam thickness) becomes close to 1.

Next, actions and effects of the present embodiment will be described.

In optical scanning device 100 according to the first embodiment, as illustrated in FIG. 1, optical scanning device 100 includes first elastic layer 41 and second elastic layer 42. First elastic layer 41 is superposed on first torsion beam 21. Second elastic layer 42 is superposed on second torsion beam 22. This allows an increase in dimension of first torsion beam 21 and second torsion beam 22 of optical scanning device 100 in the thickness direction (Z-axis direction). The vertical (Z-axis direction) dimension of active layer LA is smaller than the horizontal (Y-axis direction) dimension of active layer LA. This makes the aspect ratio of first torsion beam 21 and second torsion beam 22 close to 1 as compared with a case where first elastic layer 41 and second elastic layer 42 are not disposed. This can reduce the hard spring effect of optical scanning device 100 at the positions of first torsion beam 21 and second torsion beam 22 as compared with the case where first elastic layer 41 and second elastic layer 42 are not disposed.

As illustrated in FIG. 1, first elastic layer 41 is superposed on first torsion beam 21. Second elastic layer 42 is superposed on second torsion beam 22. This increases the dimension of first torsion beam 21 and second torsion beam 22 of optical scanning device 100 in the thickness direction (Z-axis direction) and curbs an increase in the dimension of active layer LA in the thickness direction (Z-axis direction). This in turn curbs an increase in the dimension of active layer LA of rotator 1 in the thickness direction (Z-axis direction). It is therefore possible to curb a decrease in the maximum deflection angle of rotator 1. As a result, it is possible to achieve both a reduction in the hard spring effect of optical scanning device 100 at the positions of first torsion beam 21 and second torsion beam 22 and a decrease in the maximum deflection angle of rotator 1.

As illustrated in FIG. 1, first elastic layer 41 and second elastic layer 42 are each an elastic material higher in fatigue life higher than metal. This makes first elastic layer 41 and second elastic layer 42 less susceptible to deterioration even when the rotation of rotator 1 repeatedly applies stress to first elastic layer 41 and second elastic layer 42. Specifically, it is possible to make first elastic layer 41 and second elastic layer 42 less susceptible to deterioration than a case where the material of first elastic layer 41 and second elastic layer 42 is metal. It is therefore possible to provide optical scanning device 100 having high long-term reliability.

As illustrated in FIG. 2, optical scanning device 100 includes magnet M. Rotator 1 includes coil wiring 5. Rotator 1 is to be rotated by Lorentz force generated by the current flowing through coil wiring 5 and magnetic force generated from magnet M. This allows rotator 1 to rotate. This allows reflector 10 superposed on rotator 1 to rotate. This in turn allows reflector 10 to reflect light at a desired reflection angle.

As illustrated in FIG. 2, the material of first elastic layer 41 and second elastic layer 42 contains silicon (Si). Silicon (Si) is higher in fatigue life than metal. This makes first elastic layer 41 and second elastic layer 42 higher in fatigue life than metal. This in turn can make first elastic layer 41 and second elastic layer 42 less susceptible to deterioration than a case where the material of first elastic layer 41 and second elastic layer 42 contains metal.

As illustrated in FIG. 2, the material of first elastic layer 41 and second elastic layer 42 contains polysilicon. Polysilicon is higher in fatigue life than metal. This makes first elastic layer 41 and second elastic layer 42 higher in fatigue life than metal. This in turn can make first elastic layer 41 and second elastic layer 42 less susceptible to deterioration than a case where the material of first elastic layer 41 and second elastic layer 42 contains metal.

As illustrated in FIG. 2, the material of first elastic layer 41 and second elastic layer 42 contains monocrystalline silicon (Si). Monocrystalline silicon (Si) is higher in fatigue life than metal. This makes first elastic layer 41 and second elastic layer 42 higher in fatigue life than metal. This in turn can make first elastic layer 41 and second elastic layer 42 less susceptible to deterioration than a case where the material of first elastic layer 41 and second elastic layer 42 contains metal.

As illustrated in FIG. 2, the material of first elastic layer 41 and second elastic layer 42 contains monocrystalline silicon (Si). Therefore, first elastic layer 41 and second elastic layer 42 are made of, for example, a monocrystalline silicon wafer. The thickness of the monocrystalline silicon wafer can be controlled more easily than the thickness of polysilicon. Specifically, when first elastic layer 41 and second elastic layer 42 are made of polysilicon, the thicknesses of first elastic layer 41 and second elastic layer 42 is controlled on the basis of a time taken for forming first elastic layer 41 and second elastic layer 42 on surface oxide film LOS. When first elastic layer 41 and second elastic layer 42 are made of a monocrystalline silicon wafer, the thickness of the monocrystalline silicon wafer can be controlled in advance during manufacture of the monocrystalline silicon wafer. This makes the control of the thicknesses of first elastic layer 41 and second elastic layer 42 easy as compared with a case where first elastic layer 41 and second elastic layer 42 contain polysilicon.

In optical scanning device 100 according to the first modification of the first embodiment, as illustrated in FIG. 4, rotator 1 includes recess 11. This makes rotator 1 according to the present embodiment lighter than solid rotator 1. This makes the moment of inertia of rotator 1 according to the present embodiment smaller than the moment of inertia of solid rotator 1. This in turn allows an increase in the maximum deflection angle.

In the first modification of the first embodiment, the ratio of the moment of inertia of active layer LA to the moment of inertia of entire rotator 1 is higher than a corresponding ratio for solid rotator 1. Therefore, if the dimension of active layer LA in the thickness direction (Z-axis direction) increases, the maximum deflection angle decreases as compared with solid rotator 1. In optical scanning device 100 according to the present disclosure, since first elastic layer 41 and second elastic layer 42 are superposed on second active layer 31A, it is possible to curb an increase in the dimension of active layer LA in the thickness direction (Z-axis direction). Therefore, in optical scanning device 100 according to the present disclosure, even when rotator 1 includes recess 11, it is possible to curb a decrease in the maximum deflection angle.

In optical scanning device 100 according to the second modification of the first embodiment, as illustrated in FIG. 5, lower insulating film LIT is curved upward along first elastic layer 41 and the second elastic layer 42. This eliminates the need of making the distance between the upper surface of lower insulating film LIT and surface oxide film LOS uniform. It is therefore possible to easily process lower insulating film LIT.

The method for manufacturing optical scanning device 100 according to the first embodiment includes the providing step. As illustrated in FIG. 8, in the providing step, first elastic layer 41 is provided on the opposite side to support layer LS with respect to active layer LA of substrate SUB. In the providing step, second elastic layer 42 is provided, apart from first elastic layer 41, on the opposite side to support layer LS with respect to active layer LA of substrate SUB. As illustrated in FIGS. 8 and 3, this increases the dimension of first torsion beam 21 and second torsion beam 22 of optical scanning device 100 in the thickness direction (Z-axis direction) and curbs an increase in the dimension of active layer LA in the thickness direction (Z-axis direction). It is therefore possible to reduce the hard spring effect and to curb a decrease in the maximum deflection angle of rotator 1.

As illustrated in FIG. 8, in the providing step, first elastic layer 41 is provided on the opposite side to support layer LS with respect to active layer LA of substrate SUB. In the providing step, second elastic layer 42 is provided, apart from first elastic layer 41, on the opposite side to support layer LS with respect to active layer LA of substrate SUB. First elastic layer 41 is an elastic material higher in fatigue life than metal. Second elastic layer 42 is an elastic material higher in fatigue life higher than metal. It is therefore possible to provide optical scanning device 100 having high long-term reliability.

Second Embodiment

Figure 12:
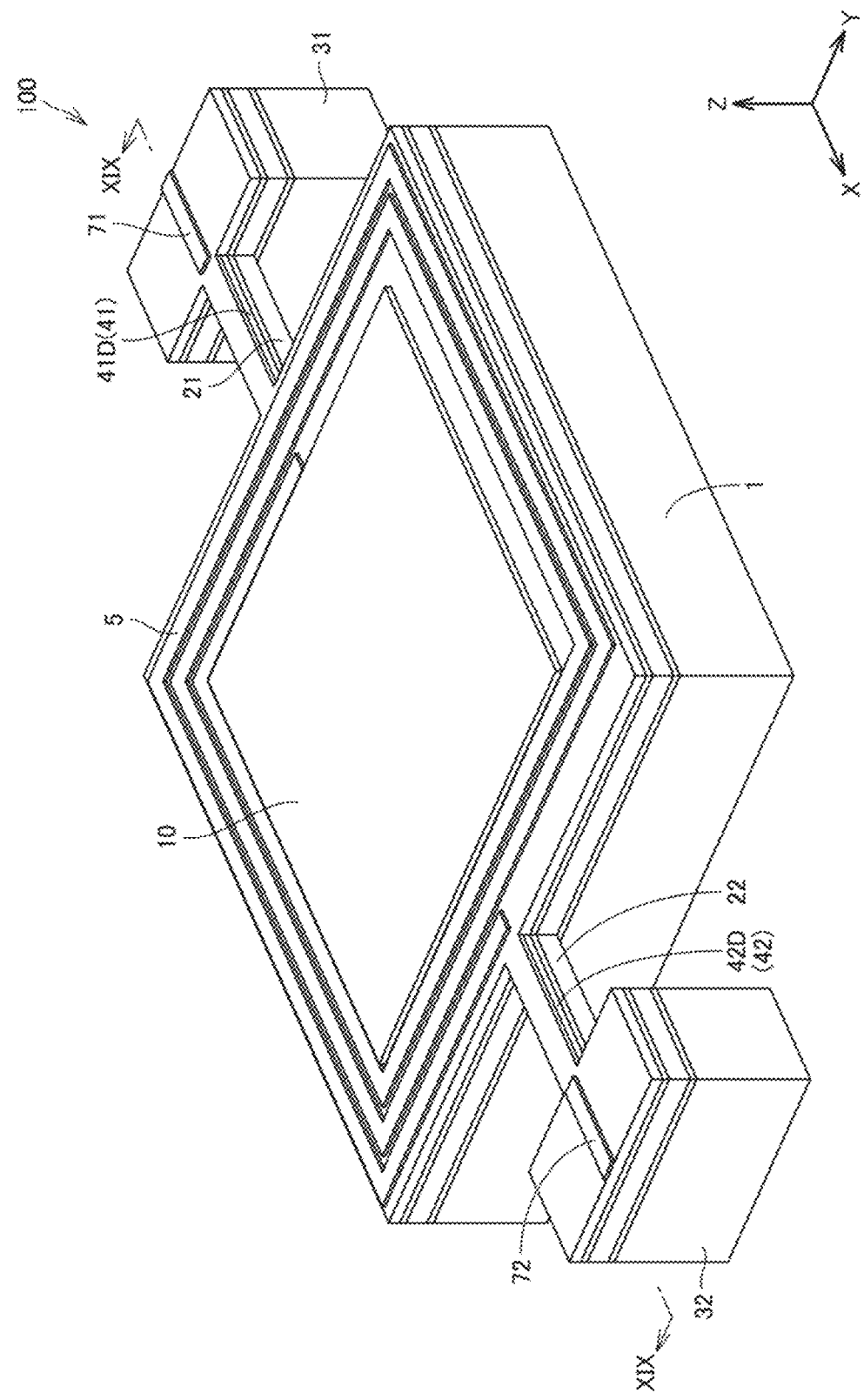
FIG. 12 is a schematic perspective view of a configuration of an optical scanning device according to a second embodiment.
Figure 13:
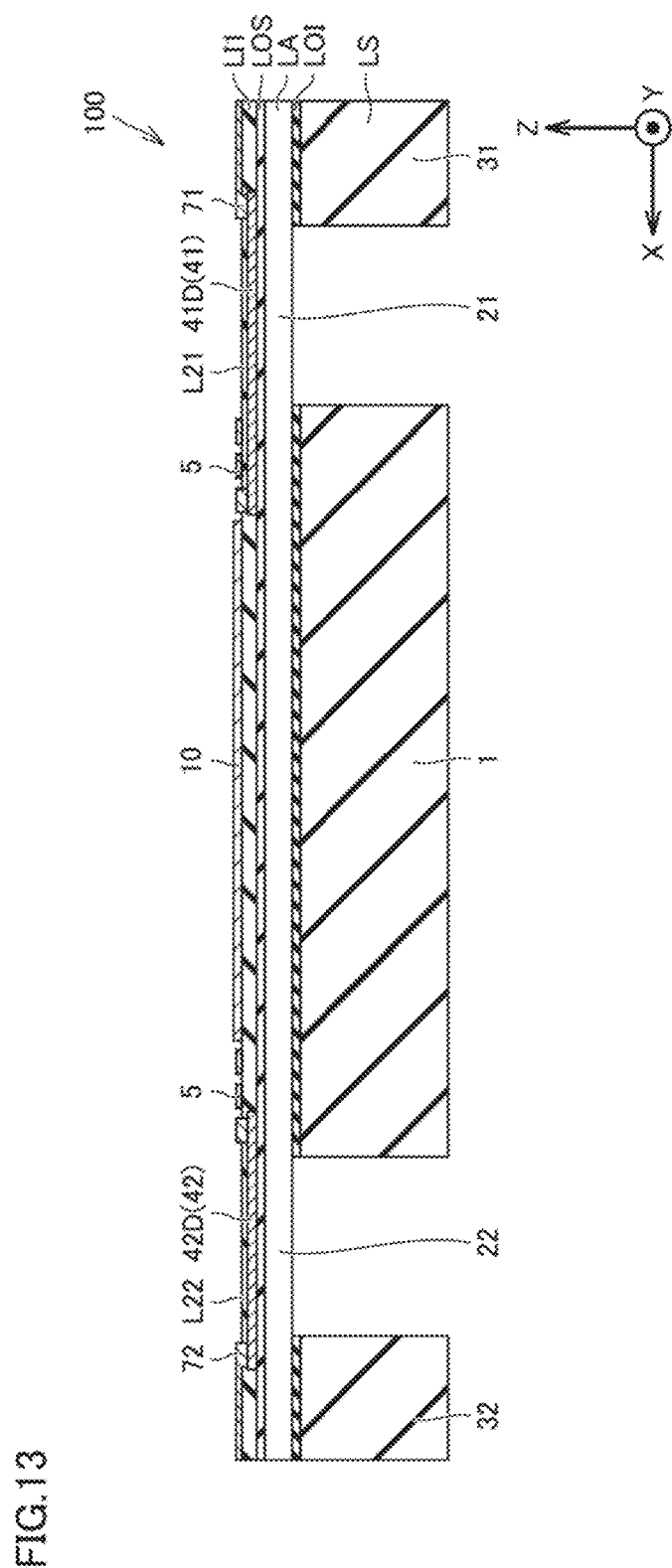
FIG. 13 is a schematic cross-sectional view of the configuration of the optical scanning device according to the second embodiment.

With reference to FIGS. 12 and 13, a description will be given below of a configuration of an optical scanning device 100 according to a second embodiment. The second embodiment is the same in configuration, manufacturing method, and actions and effects as the first embodiment unless otherwise specified. Therefore, the same components as the components according to the first embodiment am denoted by the same reference numerals to avoid the description from being redundant.

As illustrated in FIG. 12, optical scanning device 100 includes a first lead wiring 71 and a second lead wiring 72. First lead wiring 71 is disposed on first support part 31. Second lead wiring 72 is disposed on second support part 32. Rotator 1 according to the present embodiment may include recess 11 (see FIG. 4).

A material of first lead wiring 71 and second lead wiring 72 is metal having high electrical conductivity. Examples of the material of first lead wiring 71 and second lead wiring 72 include aluminum (Al), aluminum nitride (AlN), and the like. First lead wiring 71 extends toward but does not reach first torsion beam 21. Second lead wiring 72 extends toward but does not reach second torsion beam 22.

As illustrated in FIG. 13, first elastic layer 41 includes a first diffusion wiring part 41D. First diffusion wiring part 41D extends from first support part 31 to rotator 1. Second elastic layer 42 includes second diffusion wiring part 42D. Second diffusion wiring part 42D extends from second support part 32 to rotator 1.

First diffusion wiring part 41D of first elastic layer 41 and second diffusion wiring part 42D of second elastic layer 42 are higher in elastic limit than first metal wiring 61 and second metal wiring 62. A material of first diffusion wiring part 41D and second diffusion wiring part 42D contains silicon (Si).

First diffusion wiring part 41D is doped with an impurity. Second diffusion wiring part 42D is doped with an impurity. This makes first diffusion wiring part 41D and second diffusion wiring part 42D electrically conductive. First diffusion wiring part 41D and second diffusion wiring part 42D serve as wiring. First lead wiring 71 is electrically connected to second lead wiring 72 via first diffusion wiring part 41D, coil wiring 5, and second diffusion wiring part 42D.

Examples of the impurity include boron (B) and phosphorus (P). First elastic layer 41 and second elastic layer 42 are doped with the impurity at a high dopant density. Note that, in the present embodiment, the dopant density is density of the impurity used for doping. The dopant density is, for example, $1*1020$ (cm3).

Next, actions and effects of the present embodiment will be described.

In optical scanning device 100 according to the second embodiment, as illustrated in FIG. 13, first clastic layer 41 includes first diffusion wiring part 41D. Second clastic layer 42 includes second diffusion wiring part 42D. If stress applied to the beam wiring (first diffusion wiring part 41D and second diffusion wiring part 42D, or first metal wiring 61 and second metal wiring 62) is larger than the elastic limit of the beam wiring, the beam wiring may deteriorate. It is therefore necessary to make stress applied to the beam wiring lower than the elastic limit of the beam wiring. The larger the maximum deflection angle, the larger the stress applied to the beam wiring. Therefore, as the elastic limit of the beam wiring becomes higher, the maximum deflection angle can be made larger. First diffusion wiring part 41D and second diffusion wiring part 42D are higher in elastic limit than first metal wiring 61 and second metal wiring 62. This allows optical scanning device 100 according to the present embodiment to obtain a large deflection angle as compared with the case where first metal wiring 61 and second metal wiring 62 are provided as the beam wiring.

As illustrated in FIG. 13, first elastic layer 41 includes first diffusion wiring part 41D. Second elastic layer 42 includes second diffusion wiring part 42D. First diffusion wiring part 41D and second diffusion wiring part 42D are higher in elastic limit than first metal wiring 61 and second metal wiring 62. This can make, even when the maximum deflection angle is large, the beam wiring less susceptible to deterioration. It is therefore possible to provide optical scanning device 100 that is higher in long-term reliability than optical scanning device 100 including first metal wiring 61 and second metal wiring 62.

As illustrated in FIG. 12, first lead wiring 71 extends toward but does not reach first torsion beam 21. Second lead wiring 72 extends toward but does not reach second torsion beam 22. This prevents first lead wiring 71 and second lead wiring 72 from rotating even when rotator 1 rotates together with first torsion beam 21 and second torsion beam 22. This can make first lead wiring 71 and second lead wiring 72 less susceptible to deterioration.

As illustrated in FIG. 13, first lead wiring 71 is electrically connected to second lead wiring 72 via first diffusion wiring part 41D, coil wiring 5, and second diffusion wiring part 42D. This can prevent each of the first metal wiring and the second metal wiring from being deformed along the upward curve of a corresponding one of first elastic layer 41 and second elastic layer (see FIG. 5). This in turn can prevent the wiring from being broken. In particular, it is effective in optical scanning device 100 in which first elastic layer 41 and second elastic layer 42 have large dimensions in the thickness direction.

Third Embodiment

Figure 14:
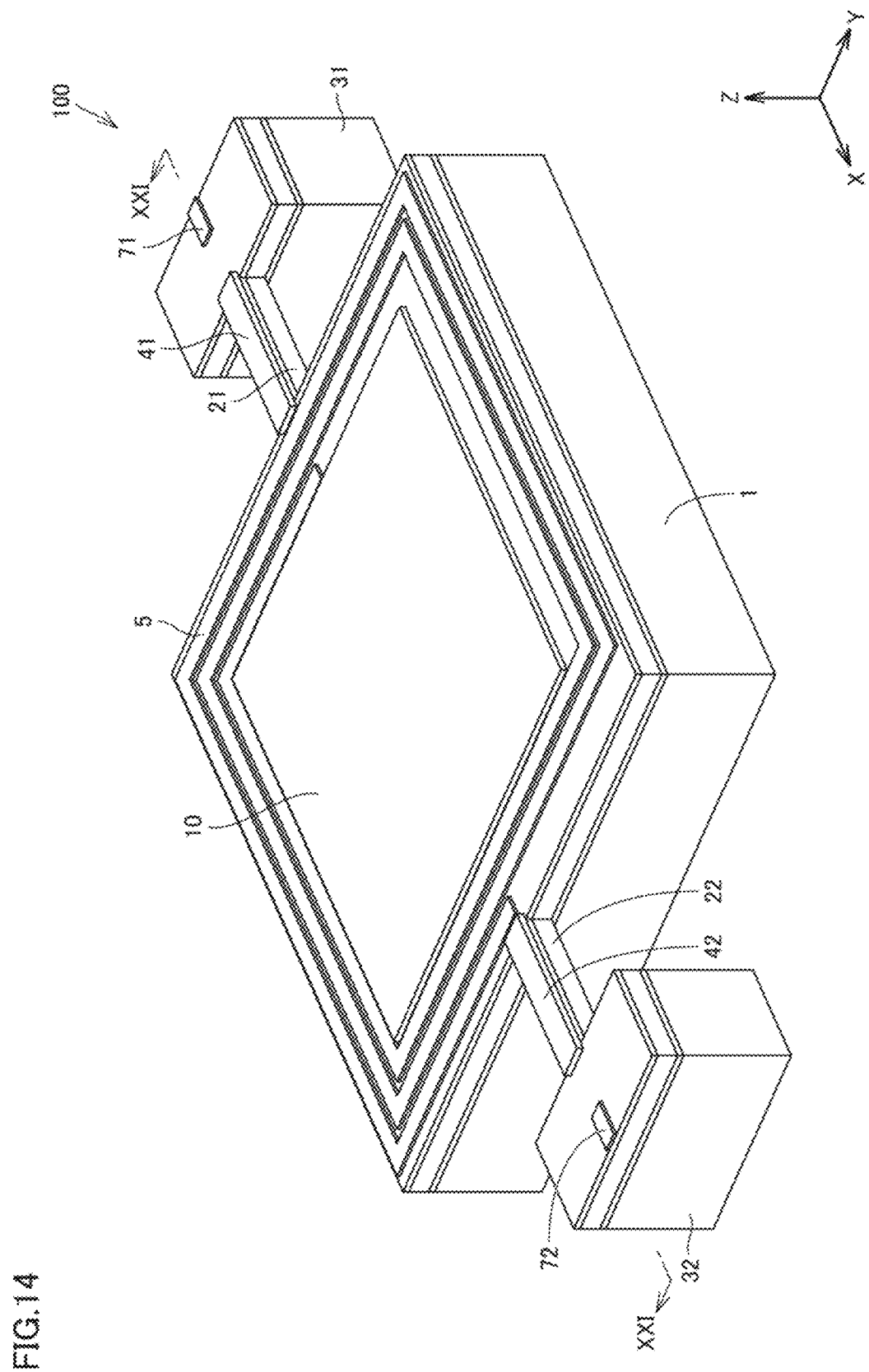
FIG. 14 is a schematic perspective view of a configuration of an optical scanning device according to a third embodiment.
Figure 15:
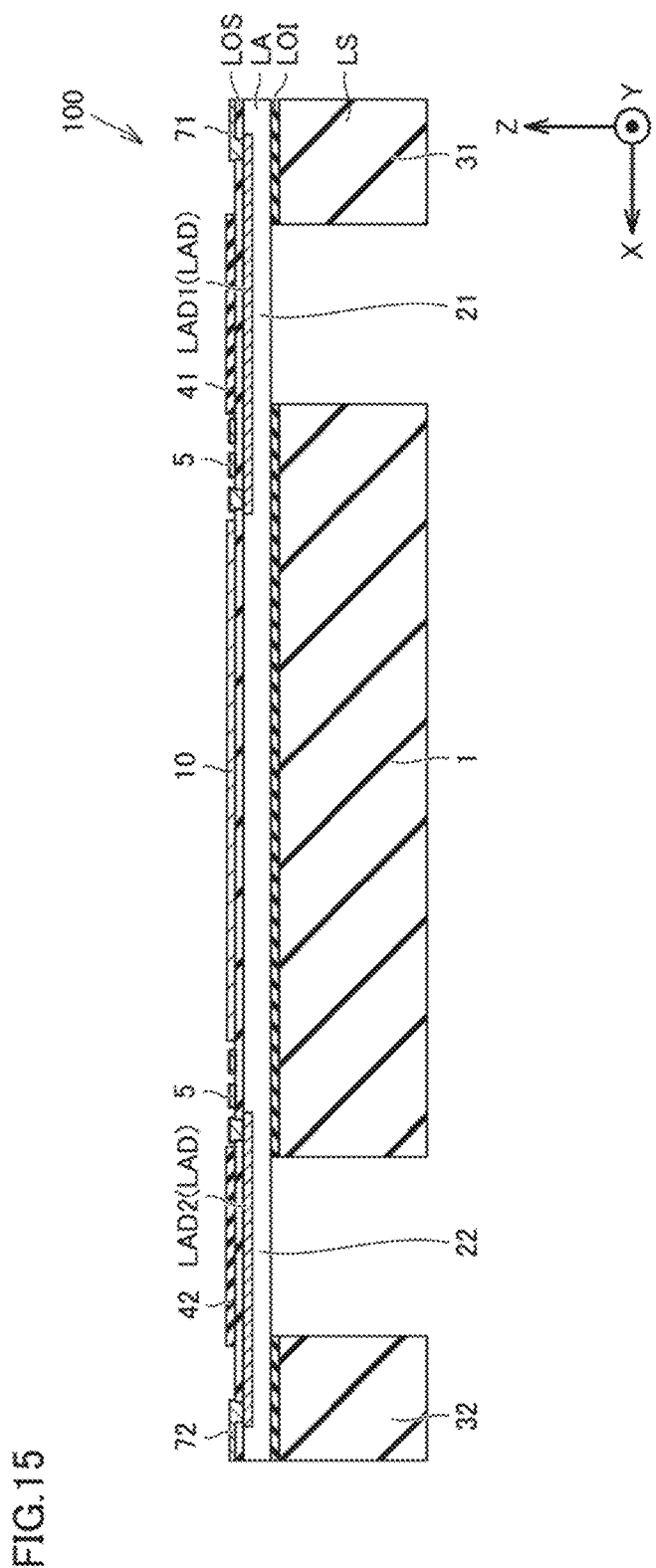
FIG. 15 is a schematic cross-sectional view of the configuration of the optical scanning device according to the third embodiment.

With reference to FIGS. 14 and 15, a description will be given below of a configuration of an optical scanning device 100 according to a third embodiment. The third embodiment is the same in configuration, manufacturing method, and actions and effects as the first embodiment unless otherwise specified. Therefore, the same components as the components according to the first embodiment are denoted by the same reference numerals to avoid the description from being redundant.

According to the present embodiment, as illustrated in FIG. 14, optical scanning device 100 includes first lead wiring 71 and second lead wiring 72. First lead wiring 71 is disposed on first support part 31. Second lead wiring 72 is disposed on second support part 32. Rotator 1 according to the present embodiment may include recess 11 (see FIG. 4).

As illustrated in FIG. 15, active layer LA includes a diffusion wiring part LAD. The diffusion wiring part LAD is doped with an impurity. The dopant density is, for example, $1*10^{20}$ (cm3). This causes the diffusion wiring part LAD to serve as wiring. First lead wiring 71 is electrically connected to second lead wiring 72 via diffusion wiring part LAD and coil wiring 5.

As illustrated in FIG. 15, diffusion wiring part LAD includes a third diffusion wiring part LAD1 and a fourth diffusion wiring part LAD2. Third diffusion wiring part LAD1 is electrically connected to first lead wiring 71 and coil wiring 5. Third diffusion wiring part LAD1 extends from first support part 31 to rotator 1. Fourth diffusion wiring part LAD2 is electrically connected to second lead wiring 72 and coil wiring 5. Fourth diffusion wiring part LAD2 extends from second support part 32 to rotator 1.

The material of active layer LA contains silicon (Si). This makes diffusion wiring part LAD higher in elastic limit than first metal wiring 61 and second metal wiring 62.

With reference to FIGS. 15 to 19, a description will be given below of a method for manufacturing optical scanning device 100 according to the third embodiment. The method for manufacturing optical scanning device 100 according to the present embodiment includes a preparing step, a doping step, a providing step, a laminating step, and a forming step.

Figure 16:
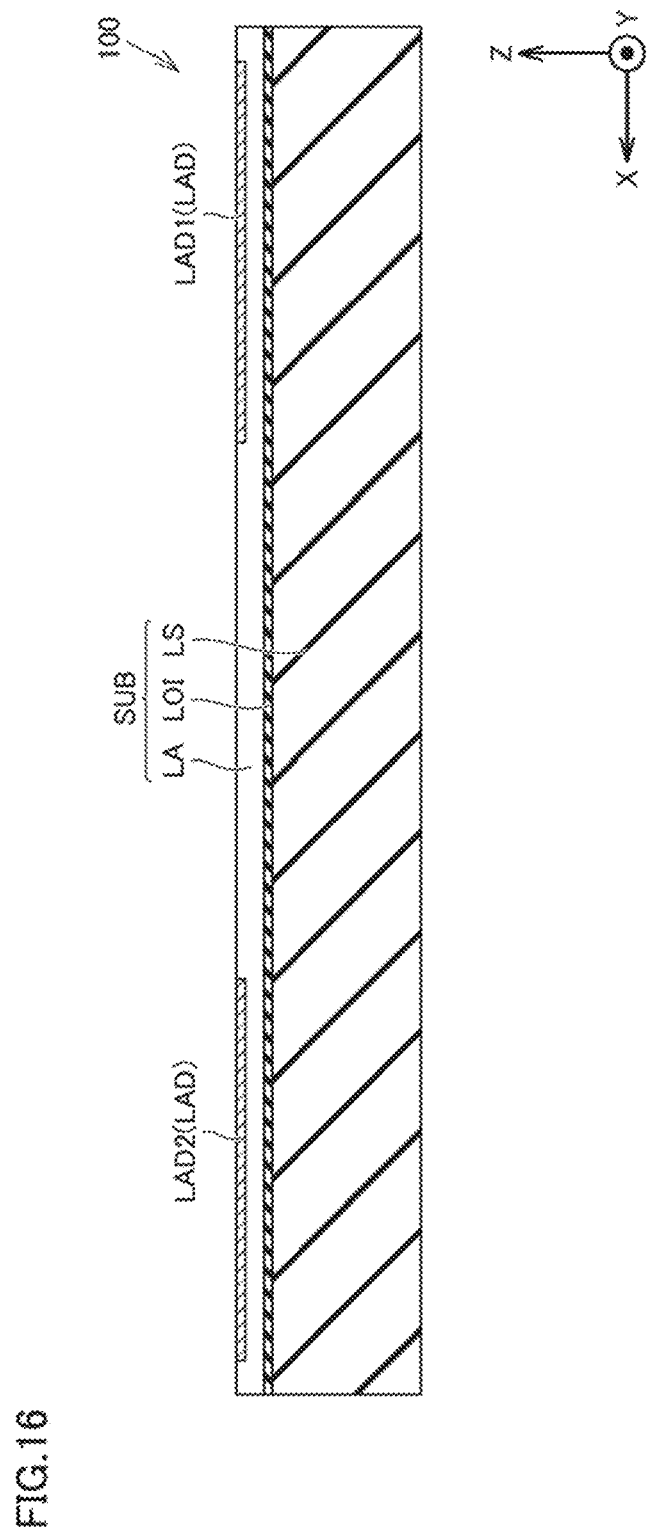
FIG. 16 is a schematic cross-sectional view of the optical scanning device according to the third embodiment in a doping step.

As illustrated in FIG. 16, in the preparing step, substrate SUB is prepared. Active layer LA of substrate SUB contains silicon (Si) as a material. Subsequently, as illustrated in FIG. 16, in the doping step, active layer LA is doped with an impurity. As a result, diffusion wiring part LAD is formed in active layer LA.

Figure 17:
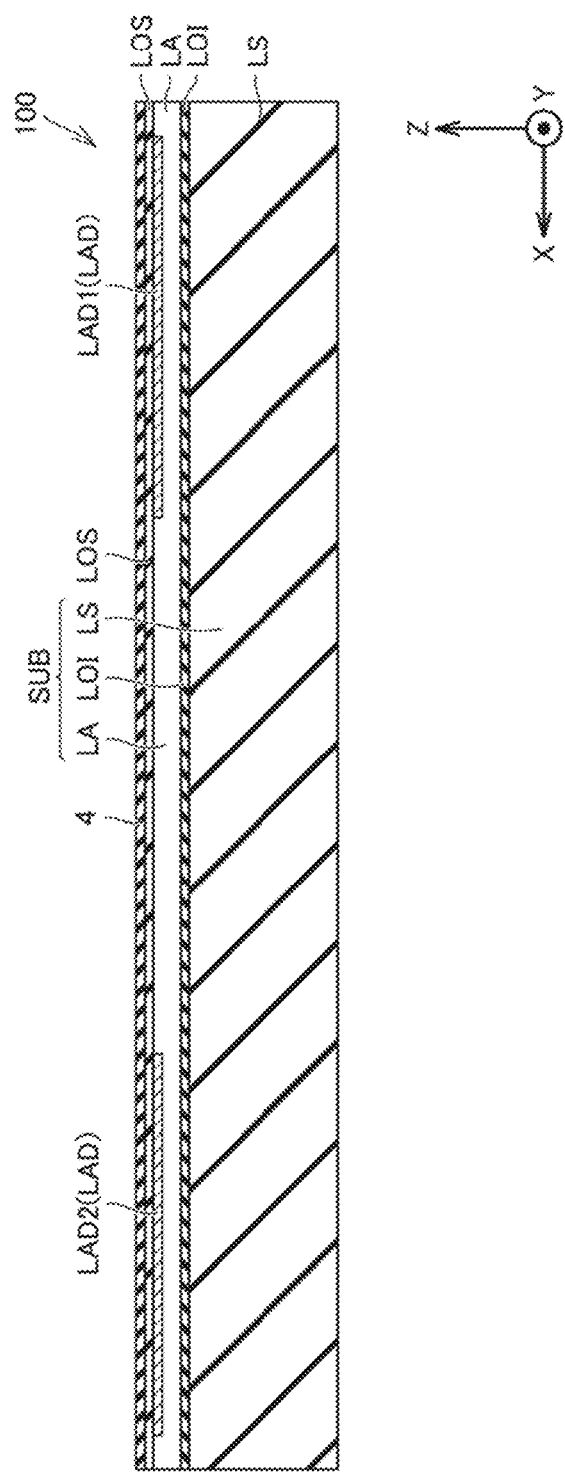
FIG. 17 is a schematic cross-sectional view of a substrate on which an elastic material is superposed according to the third embodiment.

Subsequently, as illustrated in FIG. 17, a silicon substrate is bonded to an opposite side to support layer LS with respect to active layer LA. For the bonding, for example, surface-activated bonding and room-temperature activated bonding am used. The silicon substrate includes elastic layer 4 and surface oxide film LOS. In the present embodiment, elastic layer 4 is, for example, monocrystalline silicon (Si). Surface oxide film LOS is provided on a surface of elastic layer 4. Surface oxide film LOS is desirably a thermal oxide film high in flatness. Surface oxide film LOS is interposed between elastic layer 4 and active layer LA.

Figure 18:
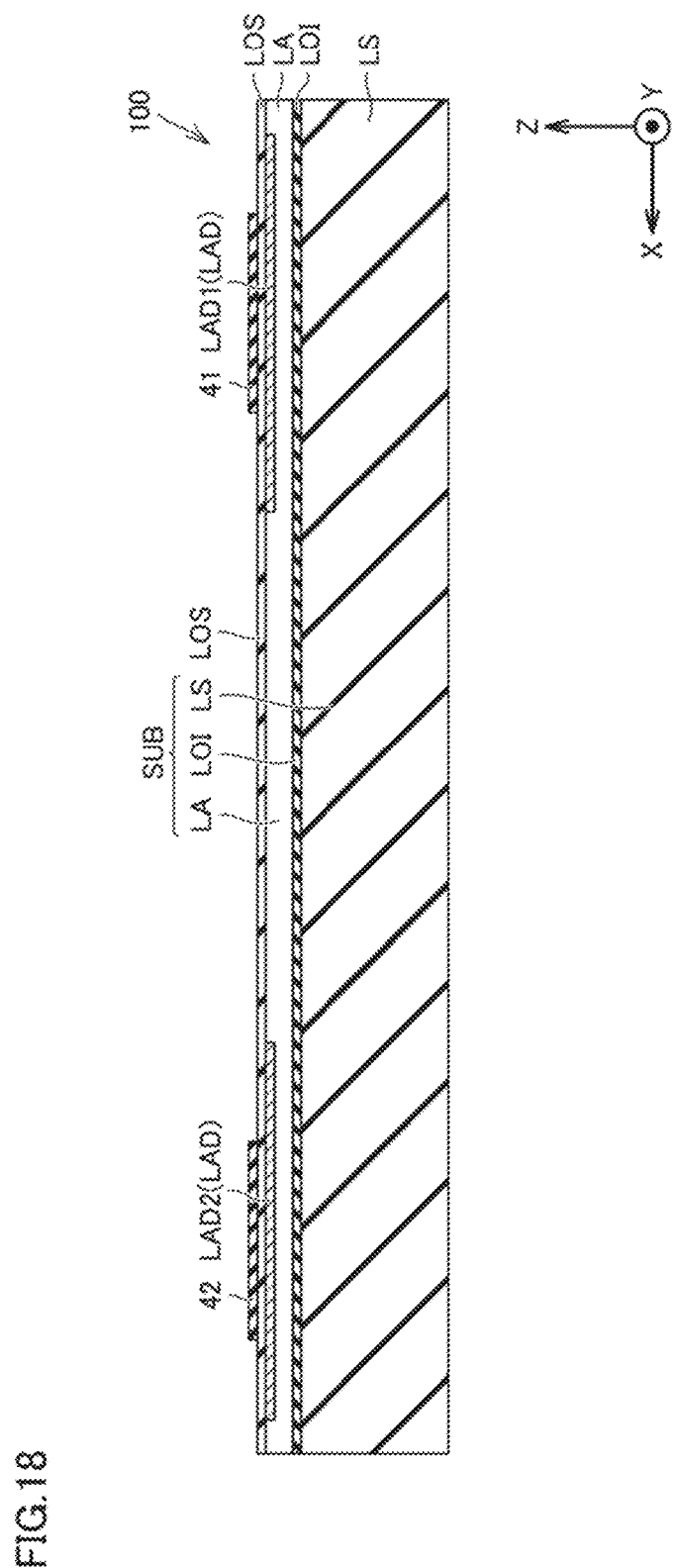
FIG. 18 is a schematic cross-sectional view of the optical scanning device according to the third embodiment in a providing step.

Subsequently, as illustrated in FIG. 18, in the providing step, first elastic layer 41 and second elastic layer 42 are provided. Elastic layer 4 (see FIG. 17) is partially removed to provide first elastic layer 41 and second elastic layer 42. Elastic layer 4 (see FIG. 17) is partially removed by patterning by, for example, deep reactive ion etching (DRIE) or the like.

Figure 19:
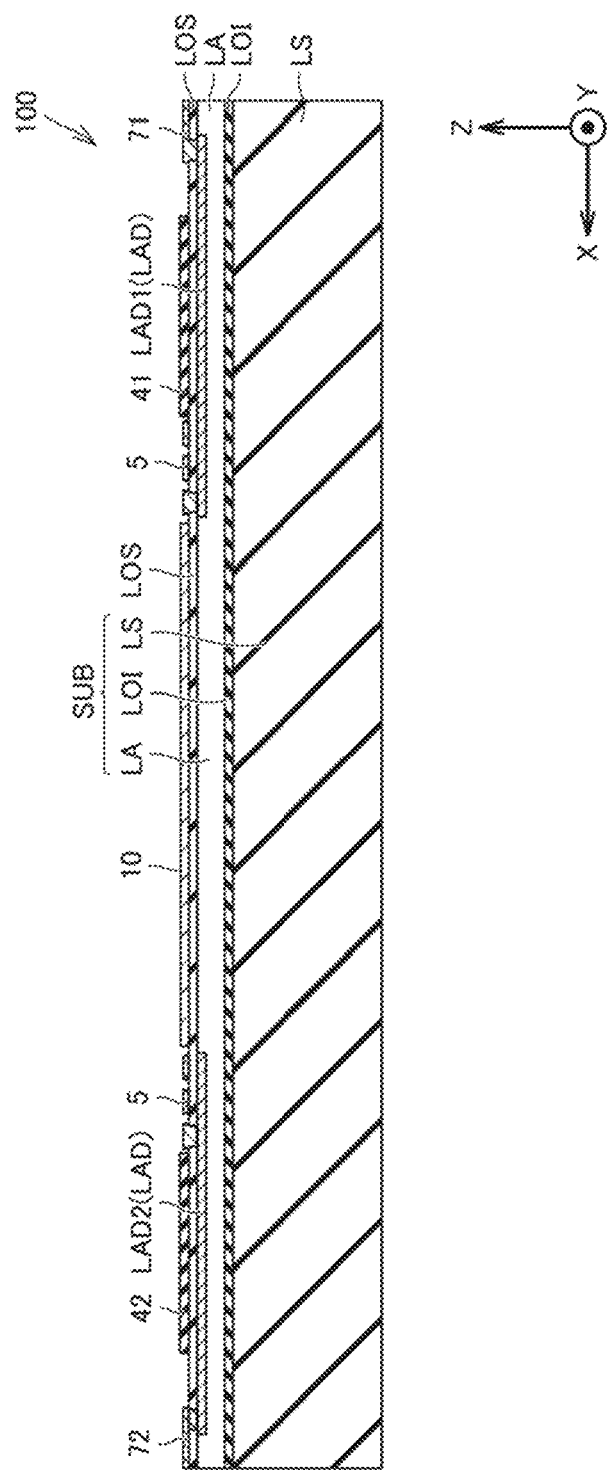
FIG. 19 is a schematic cross-sectional view of the optical scanning device according to the third embodiment in a laminating step.

Subsequently, as illustrated in FIG. 19, in the laminating step, reflector 10 is laminated on active layer LA.

Subsequently, as illustrated in FIGS. 19 and 15, in the forming step, first torsion beam 21, second torsion beam 22, rotator 1, first support part 31, and second support part 32 are formed.

Next, actions and effects of the present embodiment will be described.

In optical scanning device 100 according to the third embodiment, as illustrated in FIG. 15, active layer LA includes diffusion wiring part LAD. Diffusion wiring part LAD is higher in elastic limit than first metal wiring 61 and second metal wiring 62. This allows optical scanning device 100 according to the present embodiment to obtain a large maximum deflection angle as compared with the case where first metal wiring 61 and second metal wiring 62 are provided as the beam wiring (diffusion wiring part LAD, or first metal wiring 61 and second metal wiring 62).

As illustrated in FIG. 15, active layer LA includes diffusion wiring part LAD. Diffusion wiring LAD is higher in elastic limit than first metal wiring 61 and second metal wiring 62. This can make, even when the maximum deflection angle is large, the beam wiring less susceptible to deterioration. It is therefore possible to provide optical scanning device 100 that is higher in long-term reliability than optical scanning device 100 including first metal wiring 61 and second metal wiring 62.

As illustrated in FIG. 15, first lead wiring 71 extends toward but does not reach first torsion beam 21. Second lead wiring 72 extends toward but does not reach second torsion beam 22. This prevents first lead wiring 71 and second lead wiring 72 from rotating even when rotator 1 rotates together with first torsion beam 21 and second torsion beam 22. This can make first lead wiring 71 and second lead wiring 72 less susceptible to deterioration.

As illustrated in FIG. 15, first lead wiring 71 is electrically connected to second lead wiring 72 via diffusion wiring part LAD and coil wiring 5. This can prevent each of first metal wiring 61 and second metal wiring 62 from being deformed along the upward curve of a corresponding one of first elastic layer 41 and second elastic layer 42 (see FIG. 5). This in turn can prevent the wiring from being broken. In particular, it is effective in optical scanning device 100 in which first elastic layer 41 and second elastic layer 42 have large dimensions in the thickness direction.

Fourth Embodiment

Figure 20:
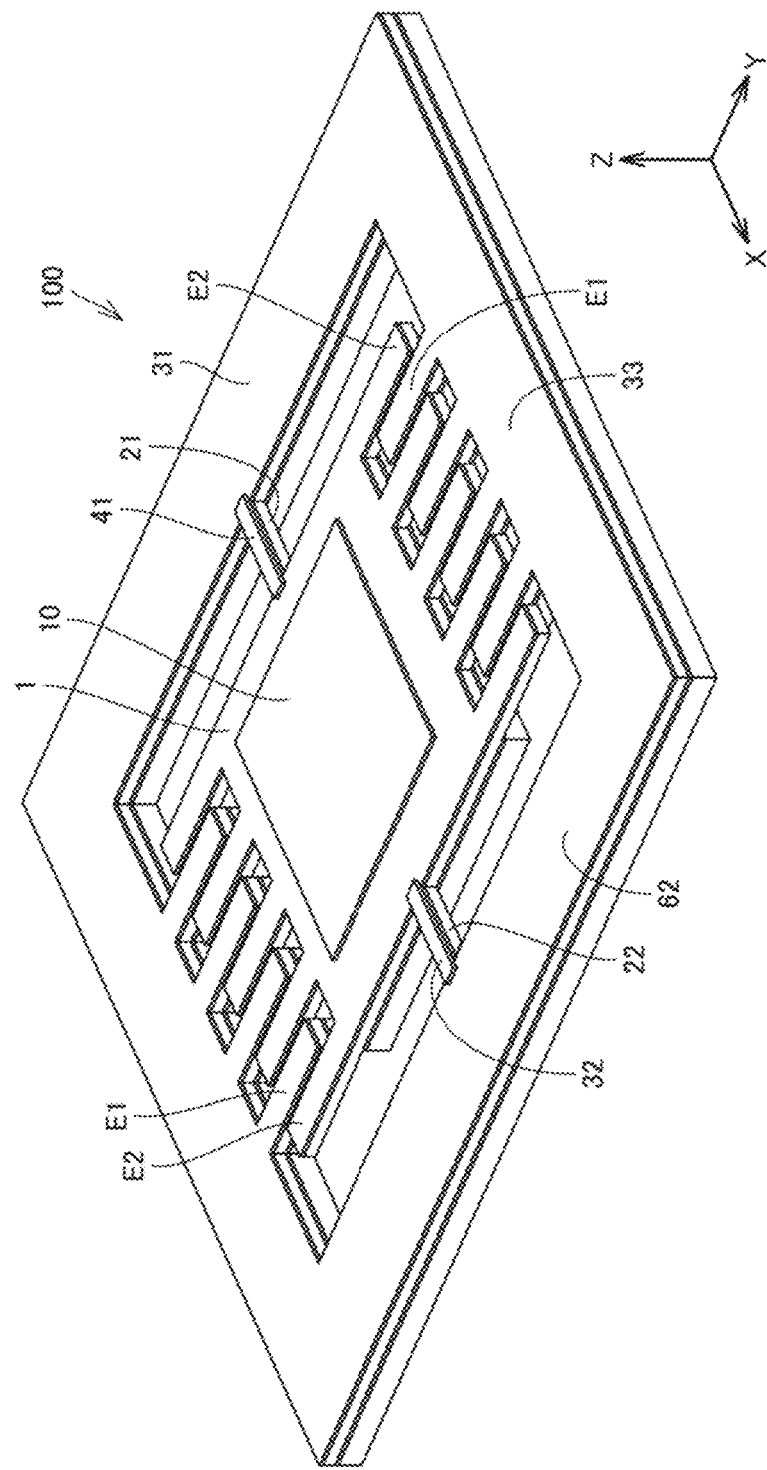
FIG. 20 is a schematic perspective view of a configuration of an optical scanning device according to a fourth embodiment.
Figure 21:
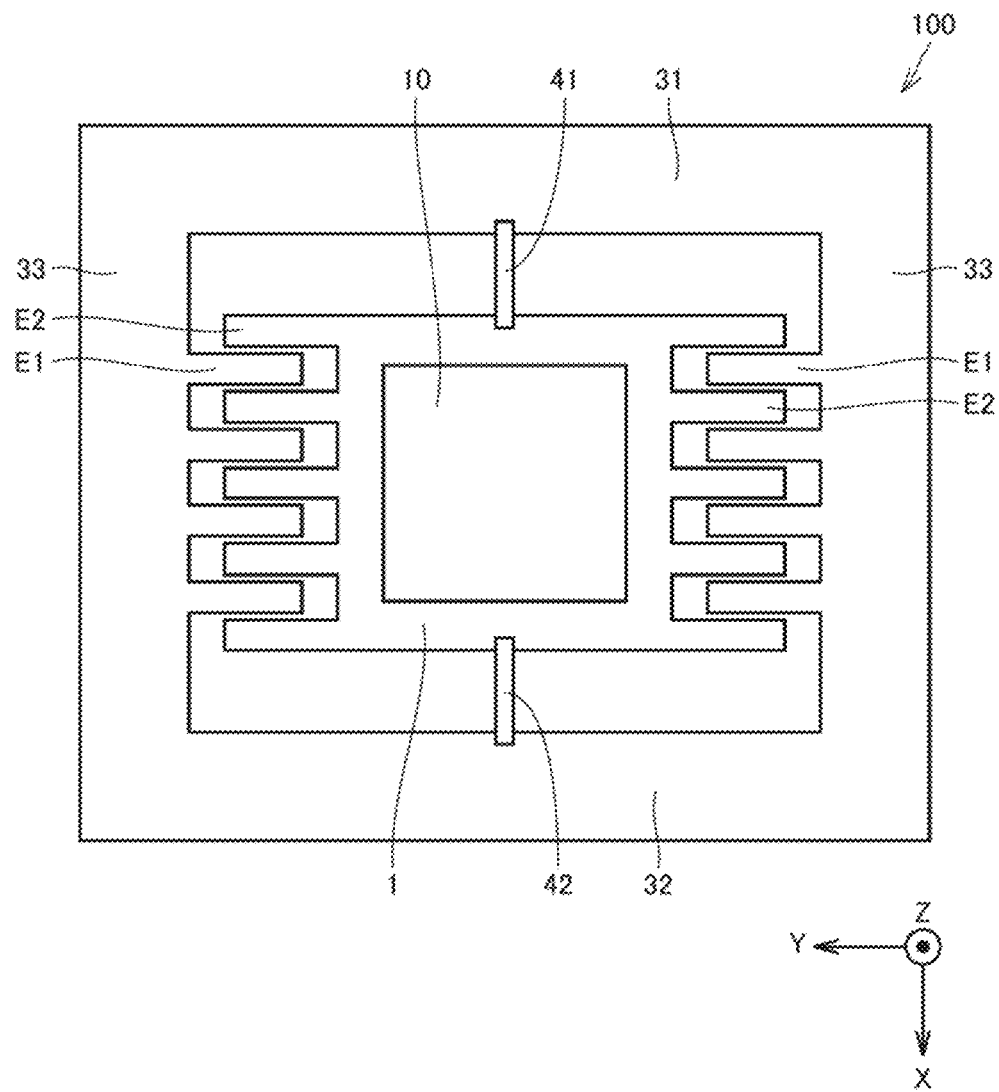
FIG. 21 is a schematic plan view of the configuration of the optical scanning device according to the fourth embodiment.

With reference to FIGS. 20 and 21, a description will be given below of a configuration of an optical scanning device 100 according to a fourth embodiment. The fourth embodiment is the same in configuration, manufacturing method, and actions and effects as the first embodiment unless otherwise specified. Therefore, the same components as the components according to the first embodiment are denoted by the same reference numerals to avoid the description from being redundant.

In the present embodiment, as illustrated in FIG. 20, optical scanning device 100 further includes a first comb-shaped electrode E1. Rotator 1 includes a second comb-shaped electrode E2. Optical scanning device 100 does not include magnet M (see FIG. 1). Optical scanning device 100 according to the present embodiment is different from optical scanning device 100 according to the first embodiment mainly in that magnet M (see FIG. 1) is not included.

As illustrated in FIG. 20, optical scanning device 100 includes a third support part 33. Third support part 33 connects first support part 31 and second support part 32. First comb-shaped electrode E1 is attached to third support part 33. First comb-shaped electrode E1 extends from third support part 33 toward rotator 1 in the Y-axis direction. Rotator 1 according to the present embodiment may include recess 11 (see FIG. 4).

As illustrated in FIG. 21, second comb-shaped electrode E2 is to mesh with first comb-shaped electrodes E1 in an alternate manner. Second comb-shaped electrode E2 extends toward third support part 33 in the Y-axis direction. First comb-shaped electrode E1 and second comb-shaped electrode E2 are to generate electrostatic force between first comb-shaped electrode E1 and second comb-shaped electrode E2 when a voltage is applied to first comb-shaped electrode E1 and second comb-shaped electrode E2. The electrostatic force acts on first comb-shaped electrode E1 and second comb-shaped electrode E2 to cause first comb-shaped electrode E1 and second comb-shaped electrode E2 to attract each other. The electrostatic force generates torque about first torsion beam 21 and second torsion beam 22 in rotator 1. Rotator 1 is to be rotated by the electrostatic force. This causes rotator 1 to rotate about first torsion beam 21 and second torsion beam 22.

Next, actions and effects of the present embodiment will be described. In optical scanning device 100 according to a fourth embodiment, as illustrated in FIG. 20, optical scanning device 100 further includes first comb-shaped electrode E1 and second comb-shaped electrode E2. Rotator 1 is to be rotated by the electrostatic force. This eliminates the need for optical scanning device 100 to include magnet M (see FIG. 1). If rotator 1 of optical scanning device 100 is to be rotated by electromagnetic force, magnet M causes an increase in dimensions of optical scanning device 100 (see FIG. 1). According to the present embodiment, since optical scanning device 100 need not include magnet M (see FIG. 1), the dimension of optical scanning device 100 in the Y-axis direction can be reduced.

Fifth Embodiment

Figure 22:
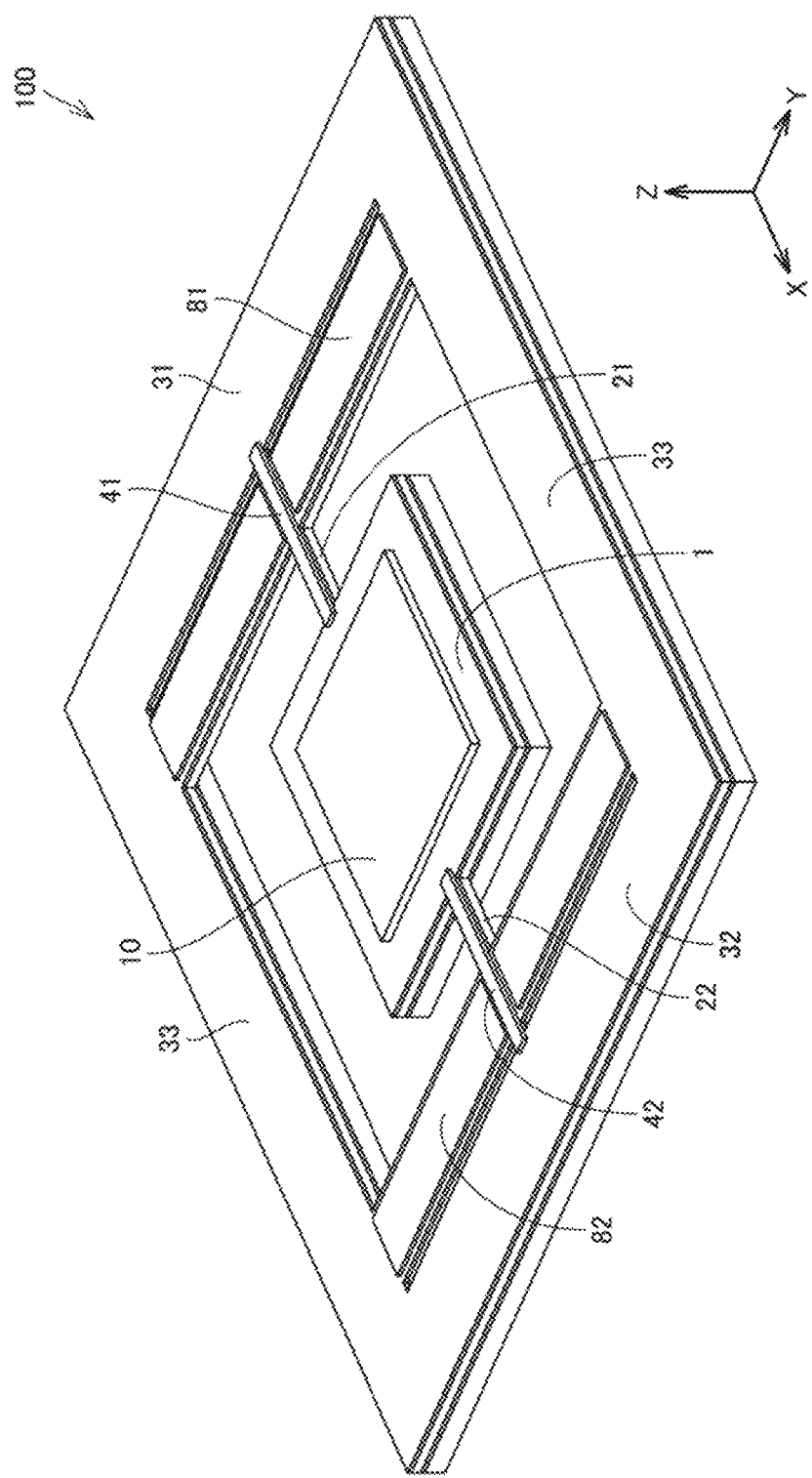
FIG. 22 is a schematic perspective view of a configuration of an optical scanning device according to a fifth embodiment.
Figure 23:
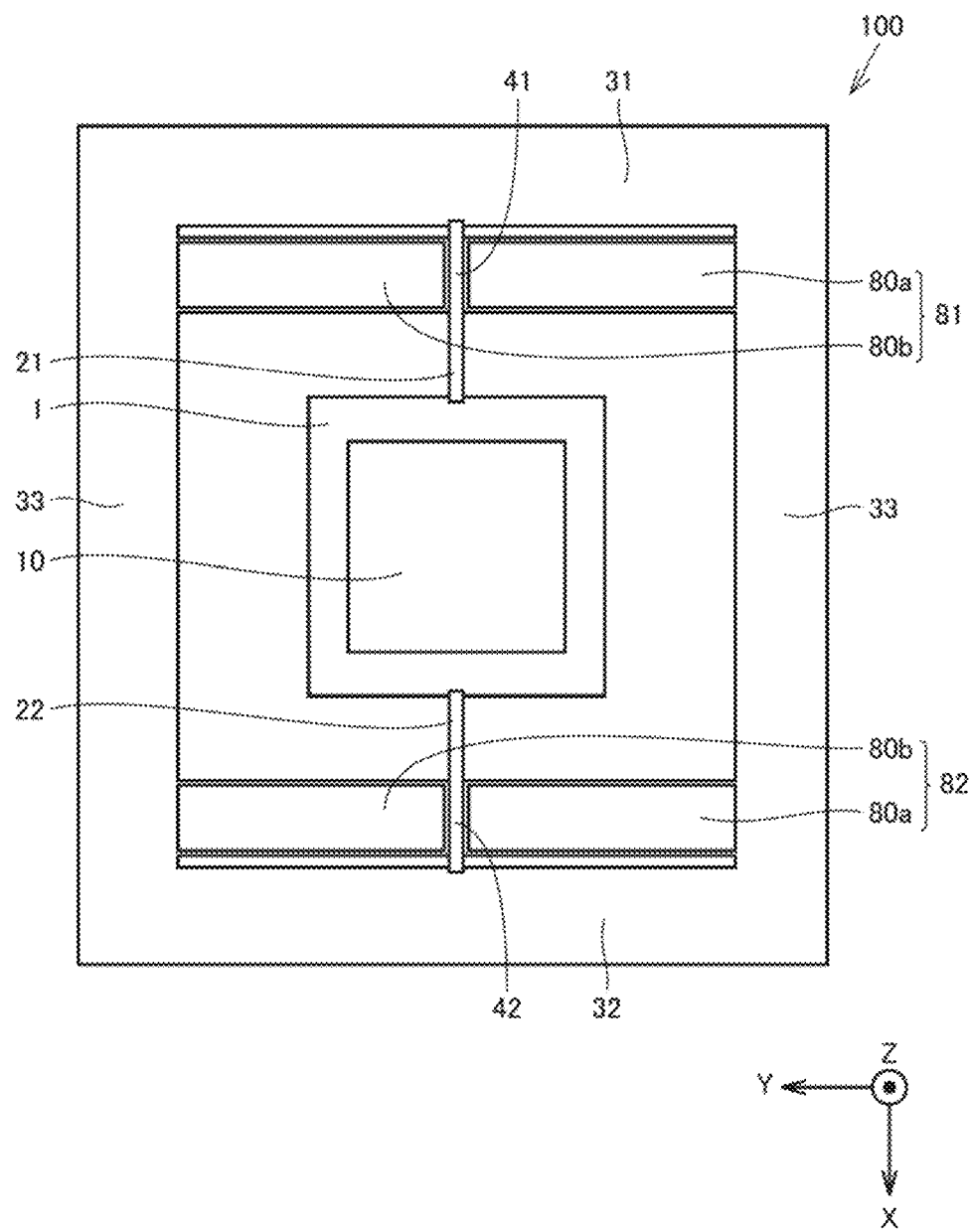
FIG. 23 is a schematic plan view of the configuration of the optical scanning device according to the fifth embodiment.

With reference to FIGS. 22 and 23, a description will be given below of a configuration of an optical scanning device 100 according to a fifth embodiment. The fifth embodiment is the same in configuration, manufacturing method, and actions and effects as the first embodiment unless otherwise specified. Therefore, the same components as the components according to the first embodiment are denoted by the same reference numerals to avoid the description from being redundant.

In the present embodiment, as illustrated in FIG. 22, optical scanning device 100 further includes a first piezoelectric actuator 81 and a second piezoelectric actuator 82. Optical scanning device 100 includes third support part 33. Optical scanning device 100 does not include magnet M (see FIG. 1). Optical scanning device 100 according to the present embodiment is different from optical scanning device 100 according to the first embodiment mainly in that magnet M (see FIG. 1) is not included.

As illustrated in FIG. 23, first piezoelectric actuator 81 is connected to first torsion beam 21. Second piezoelectric actuator 82 is connected to second torsion beam 22. Rotator 1 is to be rotated by first piezoelectric actuator 81 and second piezoelectric actuator 82. Rotator 1 according to the present embodiment may include recess 11 (see FIG. 4).

First piezoelectric actuator 81 includes a first piezoelectric element 80*a* and a second piezoelectric element 80*b* facing each other across first torsion beam 21. Second piezoelectric actuator 82 includes first piezoelectric element 80*a* and second piezoelectric element 80*b* facing each other across second torsion beam 22. First piezoelectric element 80*a* and second piezoelectric element 80*b* are to generate pressure when a voltage is applied.

First piezoelectric element 80*a* is to be driven in antiphase to second piezoelectric element 80*b*. This causes first piezoelectric element 80*a* to vibrate in antiphase to second piezoelectric element 80*b*. The vibrations of first piezoelectric element 80*a* and the second piezoelectric element 80*b* cause first torsion beam 21 and second torsion beam 22 to rotate. This causes rotator 1 connected to first torsion beam 21 and second torsion beam 22 to rotate by first piezoelectric actuator 81 and second piezoelectric actuator 82.

Next, actions and effects of the present embodiment will be described.

In optical scanning device 100 according to the fifth embodiment, as illustrated in FIG. 22, optical scanning device 100 further includes first piezoelectric actuator 81 and second piezoelectric actuator 82. Rotator 1 is to be rotated by first piezoelectric actuator 81 and second piezoelectric actuator 82. This eliminates the need for optical scanning device 100 to include magnet M (see FIG. 1). If rotator 1 of optical scanning device 100 is to be rotated by electromagnetic force, magnet M causes an increase in dimensions of optical scanning device 100 (see FIG. 1). According to the present embodiment, since optical scanning device 100 need not include magnet M (see FIG. 1), the dimension of optical scanning device 100 in the Y-axis direction can be reduced.

Sixth Embodiment

Figure 24:
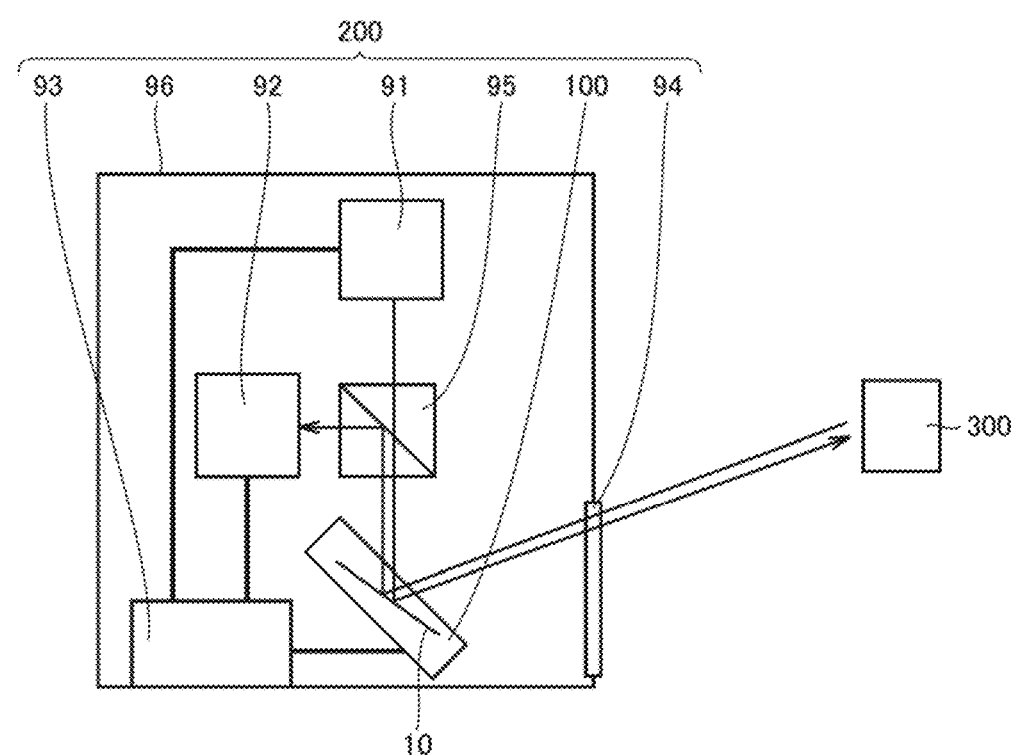
FIG. 24 is a block diagram schematically illustrating a configuration of an optical scanning device according to a sixth embodiment.
Figure 25:
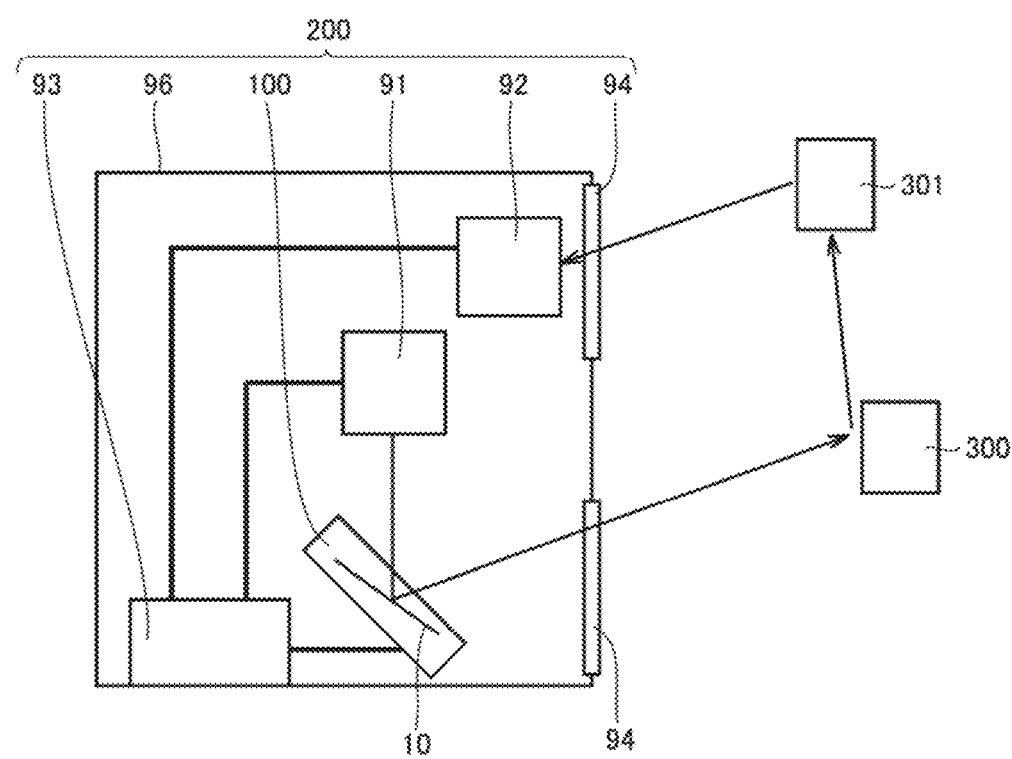
FIG. 25 is a block diagram schematically illustrating another configuration of the optical scanning device according to the sixth embodiment.

With reference to FIGS. 24 and 25, a description will be given below of a configuration of an optical scanning device 100 according to a sixth embodiment. The sixth embodiment is the same in configuration, manufacturing method, and actions and effects as the first embodiment unless otherwise specified. Therefore, the same components as the components according to the first embodiment are denoted by the same reference numerals to avoid the description from being redundant.

As illustrated in FIG. 24, optical scanning device 100 according to the present embodiment is applied to a distance measuring device 200. Distance measuring device 200 is distance measuring device 200 for generating a distance image of a measurement target 300. Note that, in the present embodiment, the distance image of measurement target 300 is an image showing a distance between distance measuring device 200 and measurement target 300. As illustrated in FIG. 24, distance measuring device 200 includes optical scanning device 100, a light source 91, a photodetector 92, and an operation unit 93. Optical scanning device 100 is optical scanning device 100 according to any one of the first to fifth embodiments. Distance measuring device 200 may include a window 94, a beam splitter 95, and a housing 96.

Light source 91 is to emit light toward reflector 10 of optical scanning device 100. Light source 91 is, for example, a laser light source or the like. In FIGS. 24 and 25, distance measuring device 200 includes one light source 91, but distance measuring device 200 may include a plurality of light sources 91. Light is, for example, laser light having a wavelength of 870 nm to 1500 nm, both inclusive.

Beam splitter 95 is disposed between light source 91 and optical scanning device 100. Beam splitter 95 is to allow the light emitted from light source 91 to pass through to optical scanning device 100. Beam splitter 95 is to reflect light reflected off reflector 10 of optical scanning device 100.

Optical scanning device 100 is to cause reflector 10 to reflect the light emitted from light source 91 to measurement target 300. Optical scanning device 100 is to deflect and reflect incident light. Optical scanning device 100 may be to reflect the light reflected off measurement target 300 to photodetector 92.

Photodetector 92 is to receive light. Specifically, photodetector 92 is to detect the light reflected off measurement target 300.

Operation unit 93 is connected to optical scanning device 100 and light source 91. Operation unit 93 includes, for example, a central processing unit (CPU) or a processor. Operation unit 93 includes, for example, a circuit having an operation function. Operation unit 93 is to generate the distance image by comparing the light emitted from light source 91 with the light reflected off measurement target 300.

Inside housing 96, optical scanning device 100, light source 91, photodetector 92, and operation unit 93 are disposed. Window 94 is provided in housing 96.

Next, a description will be given of an optical path when distance measuring device 200 generates the distance image of measurement target 300.

Light is emitted from light source 91. The light emitted from light source 91 impinges on beam splitter 95. The light that has impinged on beam splitter 95 is split. A part of the light split by beam splitter 95 impinges on reflector 10 of optical scanning device 100. The light that has impinged on reflector 10 is reflected off reflector 10 to measurement target 300. The light reflected off reflector 10 is applied to measurement target 300 through window 94. The light applied to measurement target 300 is reflected off measurement target 300. The light reflected off measurement target 300 impinges on reflector 10 through window 94. The light that has impinged on reflector 10 is reflected off reflector 10. The light reflected off reflector 10 impinges on beam splitter 95. The light that has impinged on beam splitter 95 is split. A part of the light that has impinged on beam splitter 95 is reflected off a reflector of beam splitter 95. The light reflected off the reflector of beam splitter 95 impinges on photodetector 92.

Operation unit 93 generates the distance image by comparing the light (outgoing light) emitted from light source 91 with the light (incident light) reflected off measurement target 300. For example, when the outgoing light is emitted in pulses, the incident light also impinges on photodetector 92 in pulses. For example, operation unit 93 computes a distance between distance measuring device 200 and measurement target 300 on the basis of a time difference between the pulse of the outgoing light and the pulse of the incident light.

Since optical scanning device 100 can scan light two-dimensionally, it is possible to obtain a distance image of surroundings of distance measuring device 200 on the basis of information on the scanned light.

With reference to FIG. 25, a description will be given below of a configuration of optical scanning device 100 according to a modification of the sixth embodiment.

Optical scanning device 100 according to the modification of the sixth embodiment further includes another optical system 301. The light reflected off measurement target 300 impinges on distance measuring device 200 via another optical system 301.

Next, actions and effects of the present embodiment will be described.

Distance measuring device 200 according to the sixth embodiment includes operation unit 93. Operation unit 93 is to generate the distance image by comparing the light emitted from light source 91 with the light reflected off measurement target 300. This allows a distance image showing distances from measurement target 300 to be obtained.

Distance measuring device 200 includes optical scanning device 100 according to the present disclosure. This allows distance measuring device 200 to reduce the hard spring effect. Distance measuring device 200 can curb a decrease in the maximum deflection angle of rotator 1. Distance measuring device 200 has high long-term reliability.

It should be understood that the embodiments disclosed herein are illustrative in all respects and not restrictive. The scope of the present disclosure is defined by the claims rather than the above description, and the present disclosure is intended to include the claims, equivalents of the claims, and all modifications within the scope.

REFERENCE SIGNS LIST

1: rotator, 5: coil wiring, 10: reflector, 11: recess, 21: first torsion beam, 22: second torsion beam, 31: first support part, 32: second support part, 41: first elastic layer, 41D: first diffusion wiring part, 42: second elastic layer, 42D: second diffusion wiring part, 71: first lead wiring, 72: second lead wiring, 81: first piezoelectric actuator, 82: second piezoelectric actuator, 91: light source, 92: photodetector, 93: operation unit, 100: optical scanning device, 200: distance measuring device, El: first comb-shaped electrode, E2: second comb-shaped electrode, LA: active layer, LAD: diffusion wiring part, LS: support layer, M: magnet, SUB: substrate

The invention claimed is:

1. An optical scanning device comprising: a reflector to reflect light; a rotator on which the reflector is superposed; a first torsion beam and a second torsion beam between which the rotator is interposed; a first support part, the first torsion beam being interposed between the first support part and the rotator; a second support part, the second torsion beam being interposed between the second support part and the rotator; a first elastic layer superposed on the first torsion beam; a second elastic layer superposed on the second torsion beam; a magnet disposed apart from the rotator; a first lead wiring disposed on the first support part; and a second lead wiring disposed on the second support part, wherein the rotator is rotatable with respect to the first support part and the second support part with the first torsion beam and the second torsion beam as a rotation axis, the rotator, the first torsion beam, and the second torsion beam include a common active layer, a vertical dimension of the common active layer is smaller than a horizontal dimension of the common active layer in a cross section orthogonal to a direction in which the rotator is interposed between the first torsion beam and the second torsion beam, and a material of the first elastic layer and the second elastic layer is an elastic material higher in fatigue life than metal, the rotator includes a coil wiring superposed on the active layer, the rotator is rotated by a Lorentz force generated by a current flowing through the coil wiring and a magnetic force generated from the magnet, the first elastic layer includes a first diffusion wiring part doped with a first impurity, the second elastic layer includes a second diffusion wiring part doped with a second impurity, and the first lead wiring is electrically connected to the second lead wiring via the first diffusion wiring part, the coil wiring, and the second diffusion wiring part.

2. The optical scanning device according to claim 1, wherein the rotator includes a recess, and the recess is open on an opposite side to the reflector with respect to the common active layer.

3. The optical scanning device according to claim 1, wherein
the material of the first elastic layer and the second elastic layer contains silicon.

4. The optical scanning device according to claim 3, wherein
the material of the first elastic layer and the second elastic layer contains polysilicon.

5. The optical scanning device according to claim 3, wherein
the material of the first elastic layer and the second elastic layer contains monocrystalline silicon.

6. A distance measuring device for generating a distance image of a measurement target, the distance measuring device comprising:
the optical scanning device according to claim 1;
a light source to emit the light toward the reflector of the optical scanning device;
a photodetector to receive the light; and
an operation unit connected to the optical scanning device and the light source,
wherein
the optical scanning device is to cause the reflector to reflect the light emitted from the light source to the measurement target,
the photodetector is to detect the light reflected off the measurement target, and
the operation unit is to generate the distance image by comparing the light emitted from the light source with the light reflected off the measurement target.

7. A method for manufacturing an optical scanning device, comprising: preparing a substrate on which an active layer and a support layer are laminated; providing a first elastic layer and a second elastic layer on an opposite side to the support layer with respect to the active layer, the first elastic layer and the second elastic layer being made of an elastic material higher in fatigue life than metal, the first elastic layer and the second elastic layer being provided apart from each other; laminating, on the active layer between the first elastic layer and the second elastic layer, a reflector to reflect light; and forming: a first torsion beam by removing the support layer on an opposite side to the first elastic layer with respect to the active layer; a second torsion beam by removing the support layer on an opposite side to the second elastic layer with respect to the active layer; a rotator that is interposed between the first torsion beam and the second torsion beam and on which the reflector is superposed; a first support part, the first torsion beam being interposed between the first support part and the rotator; and a second support part, the second torsion beam being interposed between the second support part and the rotator, wherein a vertical dimension of the active layer is smaller than a horizontal dimension of the active layer in a cross section orthogonal to a direction in which the rotator is interposed between the first torsion beam and the second torsion beam, the optical scanning device further comprises: a magnet disposed apart from the rotator; a first lead wiring disposed on the first support part; and a second lead wiring disposed on the second support part, the rotator includes a coil wiring superposed on the active layer, and the rotator is to be rotated by a Lorentz force generated by a current flowing through the coil wiring and a magnetic force generated from the magnet, the first elastic layer includes a first diffusion wiring part doped with a first impurity, the second elastic layer includes a second diffusion wiring part doped with a second impurity, and the first lead wiring is electrically connected to the second lead wiring via the first diffusion wiring part, the coil wiring, and the second diffusion wiring part.

* * * * *